US009869935B2

(12) United States Patent
Schmitt et al.

(10) Patent No.: US 9,869,935 B2
(45) Date of Patent: Jan. 16, 2018

(54) FAST GENERATION OF ELEMENTS WITH INDIVIDUALLY PATTERNED ANISOTROPY

(71) Applicant: ROLIC AG, Zug (CH)

(72) Inventors: Klaus Schmitt, Lorrach (DE); Hubert Seiberle, Weil am Rhein (DE)

(73) Assignee: ROLIC AG, Zug (CH)

( * ) Notice: Subject to any disclaimer, the term of this patent is extended or adjusted under 35 U.S.C. 154(b) by 0 days.

(21) Appl. No.: 14/399,624

(22) PCT Filed: May 13, 2013

(86) PCT No.: PCT/EP2013/059779
§ 371 (c)(1),
(2) Date: Nov. 7, 2014

(87) PCT Pub. No.: WO2013/178453
PCT Pub. Date: Dec. 5, 2013

(65) Prior Publication Data
US 2015/0109597 A1    Apr. 23, 2015

(30) Foreign Application Priority Data
May 30, 2012   (EP) .................................... 12170012

(51) Int. Cl.
G03B 27/72    (2006.01)
G03F 7/20     (2006.01)
(Continued)

(52) U.S. Cl.
CPC .... G03F 7/70191 (2013.01); B29D 11/00644 (2013.01); B42D 25/364 (2014.10);
(Continued)

(58) Field of Classification Search
CPC ............ B29D 11/00644; B42D 25/364; G02B 27/286; G02B 5/3025; G02B 5/3083; G02F 1/1303; G02F 2203/12; G03F 7/70191
See application file for complete search history.

(56) References Cited

U.S. PATENT DOCUMENTS 4,122,027 A    10/1978    Cole, Jr. et al.
4,401,369 A    8/1983     Jones
(Continued)

FOREIGN PATENT DOCUMENTS

JP    2005189748 A    7/2005
JP    2006518484 A    8/2006
(Continued)

OTHER PUBLICATIONS

Written Opinion of the International Searching Authority of PCT/EP2013/059779 dated Jul. 2, 2013.
(Continued)

Primary Examiner — Deoram Persaud
(74) Attorney, Agent, or Firm — Sughrue Mion, PLLC

(57) ABSTRACT

The present invention relates to an apparatus which allows producing elements with individually patterned anisotropic properties, where the pattern may vary from element to element. An apparatus according to the invention comprises a support for a substrate and an exposure unit for providing spatially modulated aligning light with a first polarization plane, wherein the exposure unit contains a light source, a spatial light modulator, which can be controlled electronically, for example by a computer, and a projection lens. The present invention furthermore relates to a method for fast production of elements with individually patterned anisotropic properties using such an apparatus.

16 Claims, 8 Drawing Sheets

(51) Int. Cl.
  *G02B 5/30* (2006.01)
  *G02B 27/28* (2006.01)
  *B29D 11/00* (2006.01)
  *B42D 25/364* (2014.01)
  *G02F 1/13* (2006.01)

(52) U.S. Cl.
  CPC ......... *G02B 5/3025* (2013.01); *G02B 5/3083* (2013.01); *G02B 27/286* (2013.01); *G02F 1/1303* (2013.01); *G02F 2203/12* (2013.01)

(56) References Cited

U.S. PATENT DOCUMENTS

| | | | |
|---|---|---|---|
| 4,565,424 A | 1/1986 | Huffman et al. | |
| 4,667,020 A | 5/1987 | Etzbach et al. | |
| 5,389,285 A | 2/1995 | Shannon et al. | |
| 5,539,074 A | 7/1996 | Herr et al. | |
| 5,808,800 A * | 9/1998 | Handschy | G02B 27/1033 349/11 |
| 5,841,581 A | 11/1998 | Tutt | |
| 6,060,224 A * | 5/2000 | Sweatt | G02B 26/0841 250/492.2 |
| 6,061,138 A * | 5/2000 | Gibbons | G02F 1/133788 356/400 |
| 6,107,427 A | 8/2000 | Herr et al. | |
| 6,201,087 B1 | 3/2001 | Herr et al. | |
| 6,496,287 B1 | 12/2002 | Seiberle et al. | |
| 6,632,909 B2 | 10/2003 | Buchecker et al. | |
| 7,375,888 B2 | 5/2008 | Moia | |
| 7,959,990 B2 | 6/2011 | Cherkaoui et al. | |
| 8,636,496 B2 * | 1/2014 | Das | G03B 27/42 264/401 |
| 2002/0027624 A1 * | 3/2002 | Seiberle | G02B 5/3016 349/73 |
| 2004/0051928 A1 * | 3/2004 | Mi | G03F 7/2002 359/247 |
| 2004/0114079 A1 * | 6/2004 | Kurtz | G02B 27/18 349/117 |
| 2004/0179158 A1 * | 9/2004 | Silverstein | G02B 5/3058 349/117 |
| 2005/0111072 A1 * | 5/2005 | Miyagaki | G02B 5/3016 359/279 |
| 2006/0176542 A1 * | 8/2006 | Muro | G01N 21/6458 359/290 |
| 2007/0021807 A1 * | 1/2007 | Kurtz | A61N 5/0616 607/88 |
| 2007/0183009 A1 | 8/2007 | Tsukagoshi et al. | |
| 2009/0161053 A1 * | 6/2009 | Kaneiwa | G02F 1/1333 349/117 |
| 2010/0301234 A1 * | 12/2010 | Dogariu | A61N 5/0616 250/492.1 |
| 2011/0262844 A1 * | 10/2011 | Tabirian | G02B 5/3083 430/2 |
| 2013/0222781 A1 | 8/2013 | Watanabe | |
| 2014/0252666 A1 * | 9/2014 | Tabirian | B29D 11/00788 264/1.34 |
| 2016/0313607 A1 * | 10/2016 | White | C08F 22/10 |
| 2016/0377779 A1 * | 12/2016 | Strohaber | G02B 5/3083 349/96 |
| 2017/0031194 A1 * | 2/2017 | Banin | G02F 1/133606 |

FOREIGN PATENT DOCUMENTS

| | | |
|---|---|---|
| JP | 2009-069493 A | 4/2009 |
| JP | 2012-042530 A | 3/2012 |
| JP | 2012-088425 A | 5/2012 |
| WO | 99/53349 A1 | 10/1999 |
| WO | 2004/074940 A1 | 9/2004 |
| WO | 2012/043497 A1 | 4/2012 |

OTHER PUBLICATIONS

International Search Report of PCT/EP2013/059779 dated Jul. 2, 2013.

* cited by examiner

FAST GENERATION OF ELEMENTS WITH INDIVIDUALLY PATTERNED ANISOTROPY

CROSS REFERENCE TO RELATED APPLICATIONS

This is a National Stage of International Application No. PCT/EP2013/059779 filed May 13, 2013, claiming priority based on European Patent Application No. 12170012.4 filed May 30, 2012, the contents of all of which are incorporated herein by reference in their entirety.

TECHNICAL FIELD

The invention relates to methods and apparatus for fast production of elements with individually patterned anisotropic properties.

BACKGROUND OF THE INVENTION

Elements with patterned anisotropic properties are, for example, known as optical elements, which include a layer comprising polymerized or cross-linked liquid crystals with locally different optical axes directions. Such layers are, for example, prepared by applying cross-linkable liquid crystal materials on top of an alignment layer exhibiting locally different alignment directions. The liquid crystal material adopts the local alignment direction of the underlying alignment layer and is then cross-linked to fix the orientation.

An alignment layer with locally different alignment directions can easily be prepared by the photo-alignment technique, where a layer of a material, which is sensitive to the polarization of light, is exposed to linearly polarized light. Patterned alignment is achieved by changing the polarization direction of the light for the exposure of different regions of the photo-alignment layer. For example, in U.S. Pat. No. 7,375,888, this is done by covering part of the photo-alignment layer by different photo-masks in subsequent exposure steps.

Elements with individually patterned anisotropic properties, such as the optical elements described above, can in principle be produced with the above method by using individual photo-masks with the respective information. However, such a method is hardly applicable for large volume production.

SUMMARY OF THE INVENTION

An object of the present invention is to provide an apparatus which allows producing elements with individually patterned anisotropic properties, where the patterns may vary from element to element. Another object of the present invention is to provide a method for fast production of such elements.

The anisotropy may, for example, be the optical absorption, the birefringence, the electrical conductivity, the molecular orientation, the property for alignment of other materials, for example for liquid crystals, or mechanical properties, such as the elasticity modulus. In the context of this application the term "alignment direction" shall refer to the symmetry axis of the anisotropic property.

In the context of the present application, a photo-alignable material is a material which is sensitive to the polarization of light and in which anisotropic properties can be induced upon exposure to polarized light of a proper wavelength. In addition, the term photo-aligned material is used to refer to a photo-alignable material that has been aligned by exposure to aligning light.

The anisotropy induced in a photo-alignable material may further be transferred to a slave material, which is in contact with the photo-alignable material. As a consequence, the slave material may also exhibit anisotropic properties. A slave material may have been mixed with the photo-alignable material before exposing it to polarized light or is brought into contact with the surface of the photo-aligned material.

In the context of the present application, a "slave material" shall refer to any material that has the capability to establish anisotropy upon contact with a photo-aligned material. The nature of the anisotropy in the photo-aligned material and in the slave material may be different from each other. For example, the slave material may exhibit light absorption anisotropy for visible light and therefore can act as a polarizer, whereas the anisotropy of the photo-aligned material may only be related to the molecular orientation. There may be also moieties of the photo-alignable material, for example in a co-polymer, which are not sensitive to aligning light, but create anisotropic properties because of interaction with the photo-sensitive moieties, which undergo a photo-reaction upon exposure to aligning light. Such a material exhibits properties of a photo-alignable material and of a slave material, but shall be included in the meaning of a photo-alignable material.

A slave material may comprise polymerizable and/or non-polymerizable compounds. Within the context of the present application the terms "polymerizable" and "polymerized" shall include the meaning of "cross-linkable" and "cross-linked", respectively. Likewise, "polymerization" shall include the meaning of "cross-linking".

Preferably, the slave material is a self organizing material. More preferred is that the slave material is a liquid crystal material and in particular preferred is that the slave material is a liquid crystal polymer material.

A liquid crystal polymer (LCP) material as used within the context of this application shall mean a liquid crystal material, which comprises liquid crystal monomers and/or liquid crystal oligomers and/or liquid crystal polymers and/or cross-linked liquid crystals. In case the liquid crystal material comprises liquid crystal monomers, such monomers may be polymerized, typically after anisotropy has been created in the LCP material due to contact with a photo-aligned material. Polymerization may be initiated by thermal treatment or by exposure to actinic light, which preferably, comprises uv-light. A LCP-material may consist of a single type of liquid crystal compound, but may also be a composition of different polymerizable and/or non-polymerizable compounds, wherein not all of the compounds have to be liquid crystal compounds. Further, an LCP material may contain additives, for example, a photo-initiator or isotropic or anisotropic fluorescent and/or non-fluorescent dyes.

In the context of this application, a layer comprising a photo-alignable material is also referred to as a light controlled molecular orientation (LCMO) layer, no matter if it has already been exposed to polarized light or not. Accordingly, an LCMO layer, as used herein, may have no anisotropic property as long as it has not been exposed to polarized light and has anisotropic property after it has been exposed to polarized light. Typically, an LCMO layer may be a thin layer applied to a substrate. It is also possible that the LCMO layer is thick and mechanically stable enough, such that it can be handled without an additional substrate. In the latter case, the LCMO layer has also the function of a substrate.

In the context of the present application, the term "aligning light" shall mean light, which can induce anisotropy in a photo-alignable material and which is at least partially linearly or elliptically polarized. Preferably, the aligning light is linearly polarized with a degree of polarization of more than 5:1. Wavelengths, intensity and energy of the aligning light are chosen depending on the photosensitivity of the photo-alignable material. Typically, the wavelengths are in the UV-A, UV-B and/or UV-C range or in the visible range. Preferably, the aligning light comprises light of wavelengths less than 450 nm. More preferred is that the aligning light comprises light of wavelengths less than 420 nm.

If the aligning light is linearly polarized, the polarization plane of the aligning light shall mean the plane defined by the propagation direction and the polarization direction of the aligning light. In case the aligning light is elliptically polarized, the polarization plane shall mean the plane defined by the propagation direction of the light and by the major axis of the polarization ellipse.

According to a first aspect of the invention, there is provided an apparatus for the production of elements with individually patterned anisotropic property, comprising
 a support for a substrate and
 an exposure unit for providing spatially modulated aligning light with a first polarization plane, wherein the exposure unit contains
  a light source
  a spatial light modulator, which can be controlled electronically, for example by a computer and
  a projection lens Such an apparatus allows to sequentially providing different patterns of spatially modulated aligning light for irradiation of LCMO layers in order to generate patterned anisotropy without using photo-masks. Because the spatial light modulator can be controlled electronically, it is possible to quickly provide different pattern of spatially modulated aligning light, thus rendering fast and automatic generation of elements with individually patterned information feasible.

Preferably, the support for the substrate can move the substrate, either stepwise or continuously or both. The support may, for example, be designed for single pieces of substrates for batch processing or it may convey a flexible substrate for continuous processing, for example, from reel to reel. An apparatus for continuous processing may be equipped with a buffer system, which allows to locally stopping movement of the substrate at the position of the exposure unit, while the substrate still moves in other parts of the apparatus.

The term substrate plane shall be used in the context of this application to refer to the plane incorporating the top surface of a substrate at the position, where it is to be exposed to the spatially modulated aligning light of the exposure unit. As the substrate is not part of the apparatus, the substrate plane is an imaginary plane for the situation when a desired substrate is to be irradiated.

In the context of this application, spatial modulation of light refers to the modulation of the light intensity.

Any kind of spatial light modulator (SLM) can be used to spatially modulate the aligning light. Preferably, the SLM is a transmissive liquid crystal display (LCD) or a reflective LCD, such as a liquid crystal on silicon (LCOS-) display, a digital mirror device (DMD) or an organic light emitting diode (OLED) display.

An SLM, as used in this application, shall include any optical or electrical means required for the generation of spatially modulated light. For example, if an LCD or LCOS-display is used as an SLM, the SLM also encompasses the appropriate polarizers for polarizing the incoming light and analyzing the transmitted or reflected light, respectively, in order to generate the desired intensity modulation.

The term "SLM-light" shall mean the light, which has been spatially modulated by the SLM and which propagates along the desired projection direction. In other words, SLM-light includes only light, which is desired for the irradiation of a photo-alignable material. For example, light which is deflected from a micro-mirror of a DMD to an absorber is not included in the meaning of "SLM-light".

Polarization of the light can be done at any point on the light path between the light source and the position of a substrate to be irradiated. Means for polarization or changing the polarization state of light may be positioned anywhere between the light source and the spatial light modulator and/or between the spatial light modulator and the substrate. It is also possible that the light source emits polarized light.

In principle, any type of light source which provides light in the desired wavelength range can be used as long as the physical dimensions of the light source are such that they are compatible with the optics of the exposure unit. Preferably, the light source is a high pressure or ultra high pressure mercury lamp or a light emitting diode (LED). The spatial light modulator may be self emitting and may be based on organic light emitting diodes (OLED). In this case, the light source is considered as being part of the spatial light modulator. Preferably the light source emits light of wavelengths less than 450 nm. More preferred is that the light source emits light in the wavelength range from 350 nm to 420 nm.

Preferably an SLM has a matrix of addressable units, such as those used in commercial digital displays or projectors. These units are commonly known as pixels. An SLM according to the invention shall, however, not be limited to matrix type SLMs, but an SLM may comprise any shape and arrangement of addressable units. The term "pixel" will collectively be used in the context of the present application to refer to these addressable units, independent of their shape or arrangement.

In the context of the present application, the term "SLM exposure unit" shall mean an exposure unit, which can provide spatially modulated aligning light and which contains a light source, a projection lens and a spatial light modulator.

An SLM exposure unit shall not be restricted to configurations in which the components, such as light source, SLM, projection lens and polarization means, are located in a common housing. Rather than that, the components may be physically separated but arranged such that they together provide the function of an SLM exposure unit. For example, a polarizer providing the polarization of the aligning light shall be considered as part of the SLM exposure unit, even if the light source and the SLM are arranged in a housing and the polarizer is outside of it and, for example, is positioned close to the substrate plane.

In a preferred embodiment, the apparatus comprises means for providing aligning light with a second polarization plane. The aligning light with the second polarization plane may be provided by an additional polarized light source, which may also be an SLM exposure unit, and/or the SLM exposure unit can provide aligning light with a first and with a second polarization plane.

An apparatus according to the invention may further comprise a coating or printing unit for applying an LCMO-layer and/or a layer of a slave material, which is preferably an LCP-material. Ideally, the apparatus comprises two coating or printing units, one for applying the LCMO-layer and the other for applying a slave material, which is preferably an LCP material.

An apparatus according to the invention may further comprise a substrate handling system, which picks up and transports a substrate to different processing stages.

Preferably an apparatus according to the invention comprises a heating stage for increasing the temperature of the substrate and the coating on top of it.

The apparatus may further contain a light source providing actinic light for initiating a polymerization reaction, for example, in a slave material.

According to a second aspect of the invention there is provided a method for fast production of optical elements with individually patterned anisotropic property, which comprises
providing an LCMO layer, and
exposing the LCMO layer to the spatially modulated aligning light of an SLM exposure unit, in which the spatial modulation of the light is generated by an electronically controlled spatial light modulator.

Preferably, the photo-alignable material is sensitive to light in the wavelength range from 300 to 450 nm, more preferred it is sensitive to light in the wavelength range from 350 to 420 nm and most preferred in the range from 380 to 410 nm.

In a preferred method of the invention, the LCMO layer comprises a slave material, in which anisotropy can be created by contact with the photo-alignable material. Preferably, the slave material is an LCP material. Heating the LCMO layer during and/or after exposure to the aligning light helps to create the anisotropy in the slave material. Optionally, the method also comprises the step of initiating polymerization in a slave material by thermal treatment or exposure to actinic light.

In another preferred method of the invention, a slave material is applied on top of the irradiated LCMO layer. Preferably, the slave material is an LCP material. Heating of the layer of the slave material helps to create the anisotropy in the slave material. Optionally, the method also comprises the step of initiating polymerization in a slave material by thermal treatment or exposure to actinic light.

If all of the pixels of the SLM are switched such that the corresponding SLM-light has maximum intensity for each pixel, the spatial distribution of the intensity of the aligning light projected to the surface of the substrate may not be uniform. This may, for example, be caused by the geometry of the light source or of the projection optics. In order to homogenize the intensity distribution, the emission from each pixel of the SLM may be reduced compared to the maximum emission. The spatial intensity variation caused by the optical setup and the spatial modulation of the light by addressing the SLM in order to compensate for the non-uniformity shall not be considered as a modulation of the light in the sense of the invention. Therefore, for each pixel there is defined an on-state and an off state, which corresponds to the highest and lowest intensity levels, respectively, that are being used in operation. Accordingly, the on-state shall be defined as 100% light intensity, although it does not correspond to the maximum possible light intensity, for example due to calibration.

In the context of the present application the expression "projection area" shall be the area, which is illuminated in the focal plane of the SLM exposure unit, when all of the pixels of the SLM are addressed to be in the on-state.

BRIEF DESCRIPTION OF THE DRAWINGS

The invention is further illustrated by the accompanying drawing figures. It is emphasized that the various features are not necessarily drawn to scale.

DETAILED DESCRIPTION OF THE INVENTION

The methods and the apparatus according to the invention allows fast generation of elements with individually patterned anisotropic properties by projecting spatially modulated aligning light onto the surface of an LCMO layer.

According to one aspect of the invention, there is provided an apparatus, which is equipped with a support for a substrate, an exposure unit comprising a spatial light modulator for providing spatially modulated aligning light with a first polarization plane. The exposure unit comprises a light source, a projection lens and a spatial light modulator, which can be controlled electronically, for example by a computer.

A support for a substrate in the context of this application can be any mechanical part, which can carry, handle or transport a substrate. For example, it can be a simple substrate holder, on which one or more substrates can be placed for the purpose of exposure the substrate to the spatially modulated aligning light of the SLM exposure unit in a batch process. The support may also be a movable substrate holder, which can be moved to different processing stages of the apparatus. An advanced version of a support, for example a robotic arm, can additionally pick up substrates and can move the substrates to different processing stages, preferably controlled electronically, for example by a computer. The term support also includes a substrate transport system, such as reels, of a continuously producing apparatus, such as in a reel to reel production equipment.

Figure 1A:
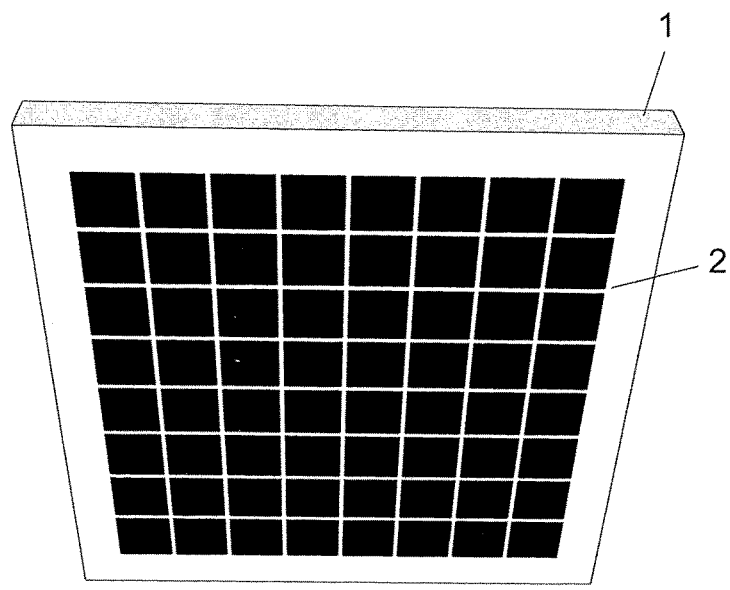
FIG. 1a shows an SLM with pixels in the off state.

FIG. 1a shows an SLM 1 with pixels 2, arranged in a matrix. The pixels in FIG. 1a are in the off-state, which means that the corresponding SLM light intensity is lowest and correspondingly all pixels are depicted in black.

Figure 1B:
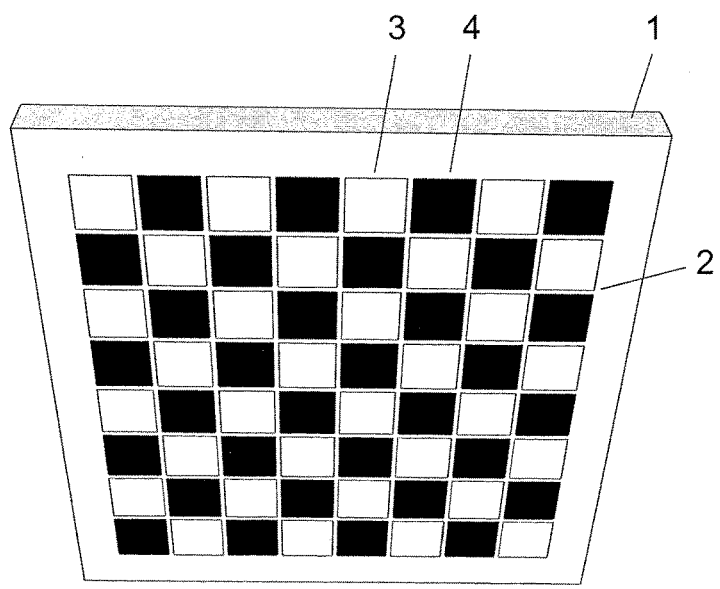
FIG. 1b shows an SLM with pixels in the on and in the off state.

In FIG. 1b pixels 2 of SLM 1 are addressed to display a checkerboard image, wherein pixels 3 are switched to the on-state and pixels 4 are in the off-state.

In general, the pixels may have any form and do not have to be arranged in a matrix. The SLM of FIGS. 1a and 1b represents any type of SLM. It can, for example, be a transmissive or reflective LCD, such as a liquid crystal on silicon (LCOS-) display, a DMD or an OLED display. For simplicity, only the pixels of the SLM are shown and not other parts of the SLM, such as electrical circuits or polarizing elements, the latter of which being required in case of LCD-SLMs in order to provide polarized light and to convert the spatial variation of polarization states into the spatial variation of light intensities.

In order to generate the polarization of the light emitted from the light source any type of polarizer that is suitable for the desired wavelength range can be used, such as wire grid polarizers, prism polarizers, Brewster type polarizers, multilayer interference polarizers or absorptive polarizers like dye type or iodine based sheet polarizers. The light source itself may emit polarized light, such that, depending on the type of SLM, additional polarizers may not be required.

Figure 2A:
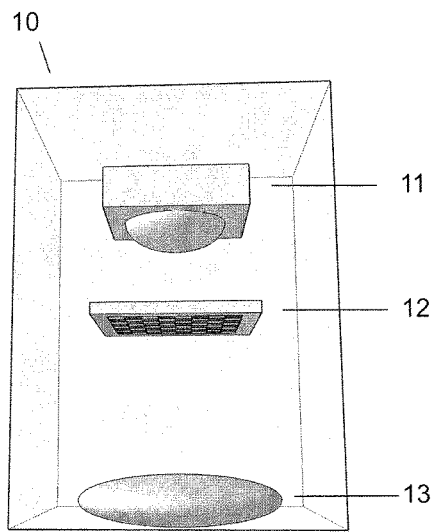
FIG. 2a shows an SLM exposure unit with an LCD as an SLM.

FIG. 2a shows a first example of an SLM exposure unit 10, comprising a light source 11, a transmissive LCD as SLM 12 and a projection lens 13. The polarizing elements required for the operation of the LCD as an SLM are assumed to be part of the SLM and are not shown. Although being considered as a part of the SLM, the polarizing elements do not necessarily be in physical contact with the LCD. The entrance polarizer of the LCD may be anywhere between the light source 11 and the LCD 12, but could also be laminated to the LCD. It is also possible, that instead of a separate polarizer the light source emits polarized light. The exit polarizer may be anywhere between the LCD and the focal plane of the SLM exposure unit. For example, the exit polarizer may be attached to the LCD, but it could also be outside an optional housing of the SLM exposure unit, even close to the position of the substrate to be irradiated.

If a reflective LCD is used as an SLM, the position of the light source is changed compared to that in the illustration of FIG. 2a and the polarizing elements as part of the SLM may be more specific for reflective LCDs, such as polarizing beam splitters.

In case an LCD is used as an SLM, the SLM light is already polarized, so that the SLM exposure unit provides spatially modulated aligning light with a first polarization plane.

Figure 2C:
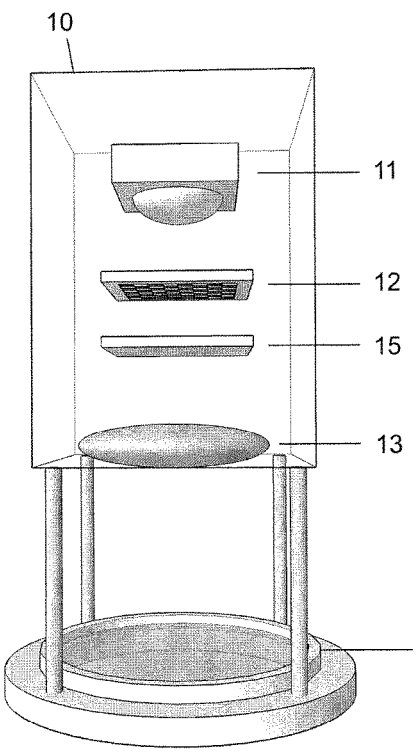
FIG. 2c shows an SLM exposure unit with an LCD as an SLM and elements for providing aligning light with additional polarization planes.
Figure 2B:
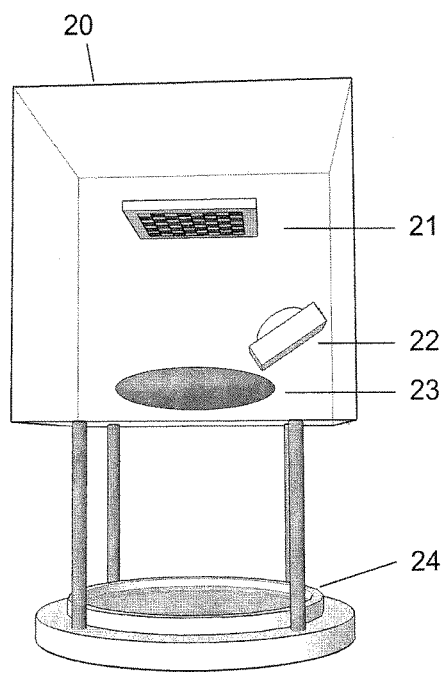
FIG. 2b shows an SLM exposure unit with a DMD as an SLM.

FIG. 2b shows a second example of an SLM exposure unit 20, which comprises a DMD as an SLM 21, a light source 22, a projection lens 23 and a polarizer 24. The polarizer may be of any type as described above and can be positioned anywhere on the light path from the light source to a substrate to be exposed to the aligning light. The SLM exposure unit of FIG. 2b provides spatially modulated aligning light with a first polarization plane.

In a preferred embodiment, the SLM exposure unit can sequentially provide aligning light with a first and with a second polarization plane. More preferred is an SLM exposure unit, which can sequentially provide aligning light with multiple polarization planes. Providing more than one polarization plane can be achieved by polarizing elements, which can be adjusted in different directions or by passive or active optical elements, which can change the polarization plane of polarized light, such as passive optical retarders or LCDs. Preferred ranges of angles between the first polarization plane and the second or further polarization planes are 35°-55° and 80°-100°, but any other angle may be used as well, depending on the desired alignment pattern to be generated. Preferably, such means for providing a second or multiple polarization plane(s) can be automatically controlled, for example by a computer. This allows to automatically performing first, second and even multiple irradiation, each with a different polarization plane and different spatial modulation pattern of the aligning light, preferably controlled by a computer.

For providing aligning light of a second or multiple polarization plane(s), a polarizer may be moveable and/or rotatable. For example, there may be two or more polarizers, each adjusted to provide a different polarization direction, which can be alternately moved into and out of the light path of the light to be polarized. The different polarizers may be separate pieces or may be integrated in a single device, such that two or more regions exhibit different polarization directions. For example, the ends of a flexible substrate exhibiting polarizing areas with different polarization directions may be fixed together to form an endless loop. Such an endless substrate with polarizing areas may be positioned and rotated such that the different polarizing areas are, for example periodically, moved into and out of the light path, in order to sequentially provide aligning light with different planes of polarization. Instead of moving different polarizers and/or polarizing areas, a polarizer may be mounted on a rotatable stage. This allows rotating the polarizer to sequentially provide different planes of polarization. As an example, polarizer 24 of the SLM exposure unit depicted in FIG. 2b may be rotatable so as to change the polarization direction. Hence, the SLM exposure unit 20 can also provide light with a second or multiple polarization plane(s). Preferably, movement and/or rotation of the polarizer(s) and/or polarizing areas is driven by a motor. Advantageously, the motor can be controlled electronically. Preferably, movement and/or rotation of the polarizer(s) is electronically synchronized with the image generation for the SLM.

If an LCD is used as an SLM, such as SLM 12 in FIG. 2a, the exit polarizer of the SLM is required for the conversion of spatially modulated polarization states into spatially modulated light intensities. It is of course possible to rotate the exit polarizer in order to change the polarization plane of the aligning light, but this may adversely affect the spatial modulation and/or intensity of the aligning light. Therefore, it is preferred that the polarization directions of the polarizing elements, which functionally are part of the SLM, are fixed relative to the LCD.

In order to provide light with a second polarization plane, an additional polarizer can be incorporated in the light path after the LCD-SLM. However, since the light from the SLM is already polarized, the intensity of the aligning light will be reduced, if the polarization directions of the SLM exit polarizer and that of the additional polarizer do not coincide. If the polarization direction of the additional polarizer is perpendicular to that of the SLM exit polarizer, the light coming from the SLM will even be fully blocked. According to a preferred embodiment of the invention, a SLM exposure unit with a transmissive or reflective LCD as an SLM further comprises a depolarizing element and an additional polarizer. A depolarizing element as used herein shall have the function of reducing or removing the polarization anisotropy in a plane perpendicular to the propagation direction of the SLM light. A depolarizing element may, for example, be an optical retarder, in particular a quarter wave retarder, which converts linearly polarized light into a circularly polarized light, the latter of which does not have a polarization anisotropy in a plane perpendicular to the propagation direction of the SLM light. Other examples of a depolarizing element are optical diffusers, poly-crystalline materials or randomly oriented liquid crystals. The additional polarizer can then be set to different polarization directions, preferably controlled electronically, without reducing the intensity of the aligning light, in order to provide aligning light with a second or multiple polarization plane(s), as described above.

An example is illustrated in FIG. 2c, wherein SLM 12 of the SLM exposure unit 10 is a transmissive LCD. In addition to the exposure unit of FIG. 2a, the exposure unit of FIG. 2c comprises a depolarizing element 15 and an additional polarizer 14. Polarizer 14 can be set to different directions in order to provide spatially modulated aligning light.

As already mentioned above, an SLM exposure unit does not require a housing. Therefore, the housings as indicated in FIGS. 2a to 2c shall not imply any limitation.

According to a preferred embodiment of the invention, the SLM exposure unit comprises an optical or electro-optical element, which can change the polarization plane of polarized light. Such an element can be positioned anywhere in the path of the polarized light to the substrate to be exposed. For example, in the exposure unit of FIG. 2a it can be placed in the light path after the SLM 12, and in the exposure unit of FIG. 2b it can be placed in the light path after the polarizer 24. Hence, light with a second or multiple polarization plane(s) can be provided sequentially without setting the polarization direction of a polarizing element to different directions.

A passive optical element for this purpose may, for example, be an optical retarder, which is moveable and/or rotatable. For example, an optical retarder can be moved into and out of the path of the polarized light in order to change its plane of polarization. It is also possible to use two or more optical retarders with differently aligned optical axis direction, which can alternately be moved into the path of the polarized light. Such retarders may be separate pieces or may be integrated in a single device, such that two or more regions exhibit optical retardance with different directions of the optical axis. For example, the ends of a flexible substrate exhibiting retardation areas with different optical axis directions may be fixed together to form an endless loop. Such an endless substrate with the different retardation regions may be positioned and rotated such that the different retardation areas are, for example periodically, moved into and out of the light path, in order to sequentially provide aligning light with different planes of polarization. Instead of moving different retarders and/or retardation areas, a retarder may be mounted on a rotatable stage. This allows rotating the retarder to sequentially provide different planes of polarization. Preferably, movement and/or rotation of the retarder(s) and/or retardation area(s) is driven by a motor. Advantageously, the motor can be controlled electronically. Preferably, movement and/or rotation of the retarder(s) is electronically synchronized with the image generation for the SLM. Preferably, the passive optical element comprises a half wave retarder or two quarter wave retarders in series, which preferably are movable and/or rotatable relative to one another.

An appropriate electro-optical element for changing the polarization plane of polarized light is, for example, a liquid-crystal (LC) cell without polarizers, wherein the configuration of the liquid-crystal and/or the effective birefringence is modified by applying a voltage to the electrodes of the cell. Depending on the type and configuration of the liquid-crystal cell, both the polarization state and/or the polarization direction of polarized light may be changed by passing the liquid-crystal cell. For example, if the liquid-crystal cell is of the twisted nematic type and the incoming light is linearly polarized then the polarization direction on passing the liquid-crystal cell does not change as long as the liquid-crystal is switched to the vertical configuration by applying a voltage to the cell. However, if no voltage is applied to the liquid-crystal cell, the liquid-crystal forms a twisted configuration, which rotates the polarization direction of the incoming polarized light by the angle of the twist, provided that the cell fulfils the wave guiding conditions and the cell is aligned appropriately with regard to the polarization direction of the incoming light. Similarly, a vertically aligned (VA) type LC-cell can be used. A VA-LC-cell does not affect the polarization state of the light as long as no voltage is applied to the cell. Upon applying a voltage to the cell, the liquid-crystal switches to a different configuration such that the liquid-crystal cell becomes birefringent for the incident polarized light. If the cell parameters and the voltage are chosen properly, then the polarization plane of the polarized light is changed on passing the cell. Preferably, the VA LC-cell acts as a half wave retarder when the voltage for changing the polarization plane of the light is applied.

Instead of a liquid-crystal cell, other electronically or magnetically controllable means can be used to modify the polarization direction of the light, for example using the magneto-optical Faraday effect.

If an electro-optical element is used for changing the polarization plane of polarized light, mechanical adjustment of a polarizer or of a passive polarization rotating element, such as a retarder, can be avoided and switching between different polarization planes is much faster.

In a preferred embodiment of the invention, the SLM exposure unit comprises a DMD as an SLM and two light sources providing the light for illumination of the SLM, wherein the light originating from the two light sources is polarized in two different polarization planes, respectively, before it arrives at the SLM. For that purpose the light sources may itself provide polarized light or polarizers may be arranged in the light paths between light source and SLM. The light of the two light sources can, for example, sequentially illuminate the SLM. Synchronously the pattern applied to the SLM may be changed, such that the exposure unit can sequentially provide spatially modulated aligning light with different patterns and polarization directions. Preferably, the origin for the illumination of the SLM varies periodically between the first and the second light source, such that the polarization direction of the light arriving at the SLM is periodically changing. This can for example be done by alternately blocking the light from the first and from the second light source, for example by mechanical or opto-electronic shutters. Instead of alternately blocking the light from the two light sources, the light sources may be alternately switched on and off, for example periodically. Preferably, LEDs are used for the two light sources.

In another preferred embodiment of the invention the apparatus comprises an additional polarized light source, providing aligning light of a second polarization plane.

Preferably, the additional polarized light source is also an SLM exposure unit. The polarization planes of the aligning light emitted from the two SLM exposure units may be identical or are different from each other. Preferably, the SLM exposure units are arranged such that the projection areas of the two exposure units overlap each other and may be identical. This allows exposing a layer simultaneously or sequentially to the aligning light of the two exposure units, without moving the substrate or the support for the substrate.

In another preferred embodiment of the invention the apparatus comprises two SLM exposure units, wherein one or both of them are arranged such that the respective aligning light is projected at an oblique angle to the substrate plane in order to induce a tilt angle in a LCMO layer. Preferably, the aligning light of both exposure units is projected at an oblique angle to the substrate plane and the incidence planes of the aligning light from both exposure units are parallel to or coincide with each other. For such an embodiment it is preferred that the oblique angles are symmetric to the normal to the substrate plane. The incidence plane as used above shall mean the plane defined by the mean propagation direction of the aligning light and the normal to the substrate plane.

Alternatively to setting the polarization plane of the aligning light to certain angles prior to irradiation, the polarization plane may rotate continuously while the spatial modulation of the aligning light changes with time. Hence, the SLM exposure unit of the apparatus according to the invention may comprise a polarizer 14 or 24 or an optical element capable of changing the polarization plane of the aligning light, which can rotate continuously.

In an apparatus, which is designed for batch processing of substrates, the substrate direction, which, for example, can be defined by a line parallel to a certain edge of the substrate, may be adjustable to different angles relative to the polarization plane of the aligning light. This would be an alternative to providing aligning light with a second polarization plane. For this purpose it is preferred that the support for the substrate is rotatable.

According to a preferred embodiment of the invention, the apparatus comprises one or more SLM exposure unit(s) and optionally an additional polarized light source as described above and further a coating or printing unit for applying an LCMO layer and/or a layer of a slave material. Ideally, the apparatus comprises two units for coating and/or printing, one for applying the LCMO layer, the other for applying the slave material. In principle, any type of coating or printing methods can be used as long as it fits with the size of the apparatus. Usable coating techniques include, but are not limited to: spin-coating, blade coating, knife coating, kiss roll coating, reverse kiss coating, cast coating, die coating, dipping, brushing, roller-coating, flow-coating, injection-molding, wire-coating, spray-coating, dip-coating, curtain-coating, air knife coating, reverse roll coating, gravure coating, slot die coating, hot melt coating, roller coating or flexo coating. Usable printing techniques include, but are not limited to: silk screen printing, relief printing, flexographic printing, jet printing, intaglio printing, direct gravure printing, offset gravure printing, lithographic printing, offset printing. Preferred methods are roller coating, slot die coating, offset printing and jet printing.

According to the invention the apparatus may further comprise one or more heating stages, which can be used to heat the coatings to predefined temperatures in order to remove residual solvent and/or to decrease the viscosity of the LCMO- and/or slave material for easier orientation. Further, a heating stage may be used to initiate polymerization in a slave material. The heating stage can make use of known means to generate and transfer the heat, for example, using an infrared heater, a warm air-blower, an oven, microwaves or a hot plate. In case the apparatus is designed for batch processing, the support itself may be heatable.

The apparatus may further comprise an additional light source as a curing unit, which provides actinic light for initiating polymerization in the slave material. Preferably, the light source provides light in a wavelength range below 420 nm. Preferred types of light sources are LEDs, such as UV-LEDs, and high pressure mercury lamps.

Preferably, an apparatus according to the invention comprises means for moving a substrate into the desired position at the different stages of the apparatus, such as that of the SLM exposure unit, the additional polarized light source, the coating or printing units and the heating stages, as far as they are present in the apparatus. It is preferred that the movement of the substrate can be controlled electronically, for example by a computer, in order to render automatic processing possible.

Figure 3:
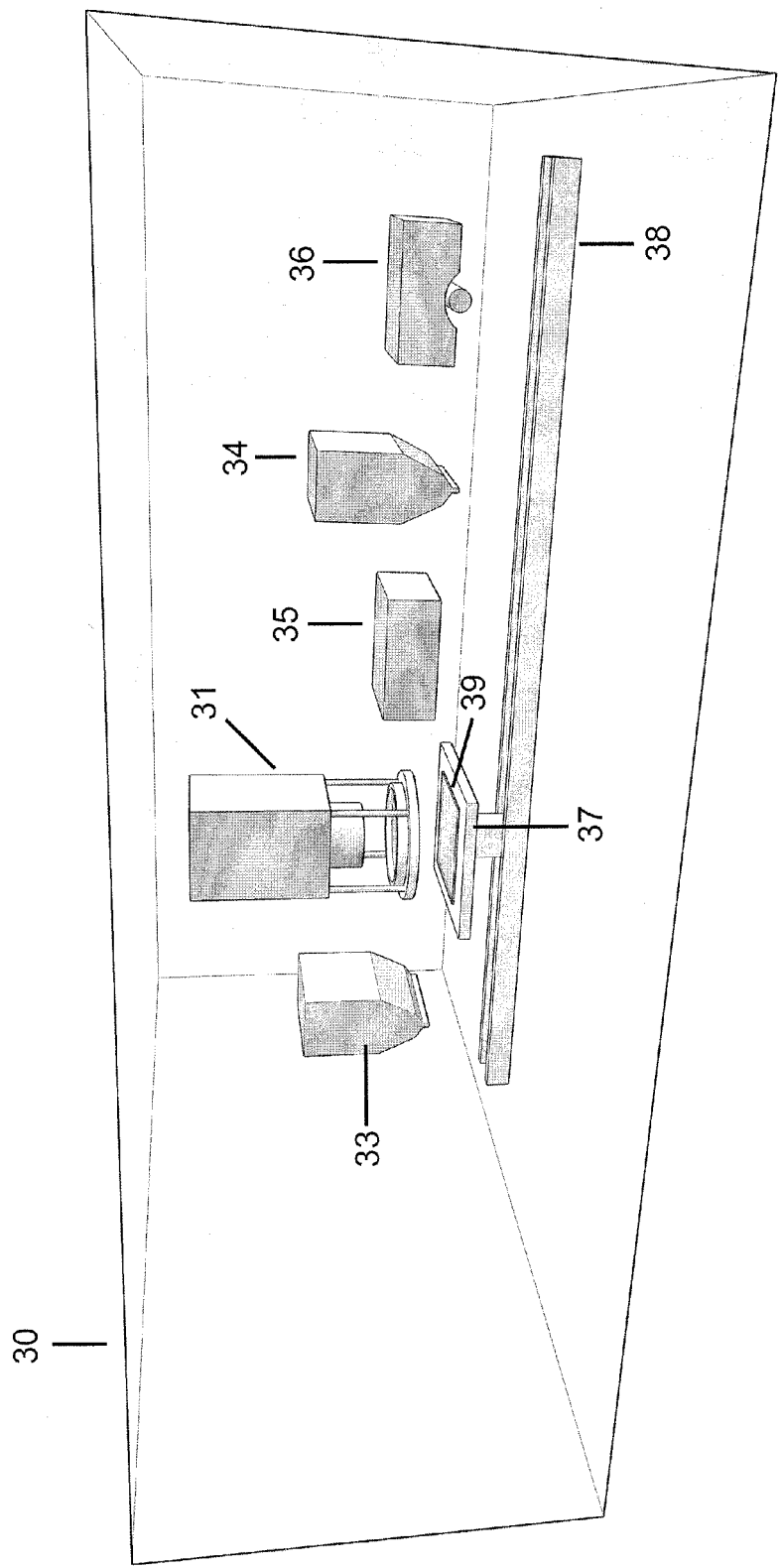
FIG. 3 is an apparatus according to the invention, in which the support can be moved along one direction.

The example of an apparatus 30 according to the invention, illustrated in FIG. 3, comprises a first coating or printing unit 33, a second coating or printing unit 34, an SLM exposure unit 31, a heater 35, a curing unit 36, a support 37 for a substrate 39 and a sliding profile 38. The support 37 can be moved along the sliding profile 38 in order to position a substrate on the support to the different units of the apparatus. Preferably, the movement of the support is controlled by a computer, which is, however, not shown in FIG. 3. The SLM exposure unit 31 may be any of those described above, which have means for providing aligning light with a first and with a second polarization plane. The SLM in the exposure unit is preferably controlled by a computer, which is again not shown in FIG. 3. Heater 35 may, for example, be an infrared heater or a warm air-blower. The curing unit 36 comprises a light source, which provides actinic light for initiating polymerization in the slave material.

In an apparatus as illustrated in FIG. 3, the first coating or printing unit 33 may be used for applying an LCMO layer to a substrate, whereas the second coating or printing unit 34 may be used for coating or printing a slave material. A production process could then, for example, be the following: positioning a substrate 39 on the support 37, moving the support with the substrate below the first coating or printing unit 33, coating or printing a solution comprising a photoalignable material to the substrate, moving the support to the heater 35 to remove the remaining solvent, moving the support to the exposure unit 31, setting the polarization plane of the exposure unit to a first direction, addressing the SLM in the exposure unit to provide a desired pattern, irradiating the LCMO layer on the substrate with the spatially modulated aligning light of the exposure unit, setting the polarization plane of the exposure unit to a second direction, addressing the SLM in the exposure unit to provide either a desired pattern or to switch all the pixels to the on-state, irradiating the substrate with the aligning light of the exposure unit, moving the support to the second coating or printing unit 34, applying a slave material on top of the LCMO layer on the substrate, moving the support underneath the heater 35 to increase the temperature of the substrate, moving the support with the substrate to the curing unit and providing actinic light for polymerization of the slave material. Depending on the type of liquid crystal material, polymerization may have to be performed under inert atmosphere. The above process, using an apparatus according to FIG. 3 may be controlled by a computer and may be fully automatic.

In an alternative embodiment according to the invention, which is also designed for batch processing, the apparatus comprises a robotic arm or any other appropriate handling system to transport the substrate to the different stages of the apparatus. Besides internal substrate transportation, the handling system may also be used to pick up substrates to be processed from a pile of substrates placed inside or outside of the apparatus and/or to deliver the processed substrates to an interface handling system or deposit it at a desired position. The substrate handling system, such as the robotic arm, is preferably controlled by a computer. Such a configuration allows, for example, automatic processing of the substrates, including all substrate transportation and adjustment steps, irradiation, coating and or printing, drying of the layers, polymerization of the slave material and managing input and output of the substrates. As an example, automatic cassette to cassette processing is feasible.

Figure 4:
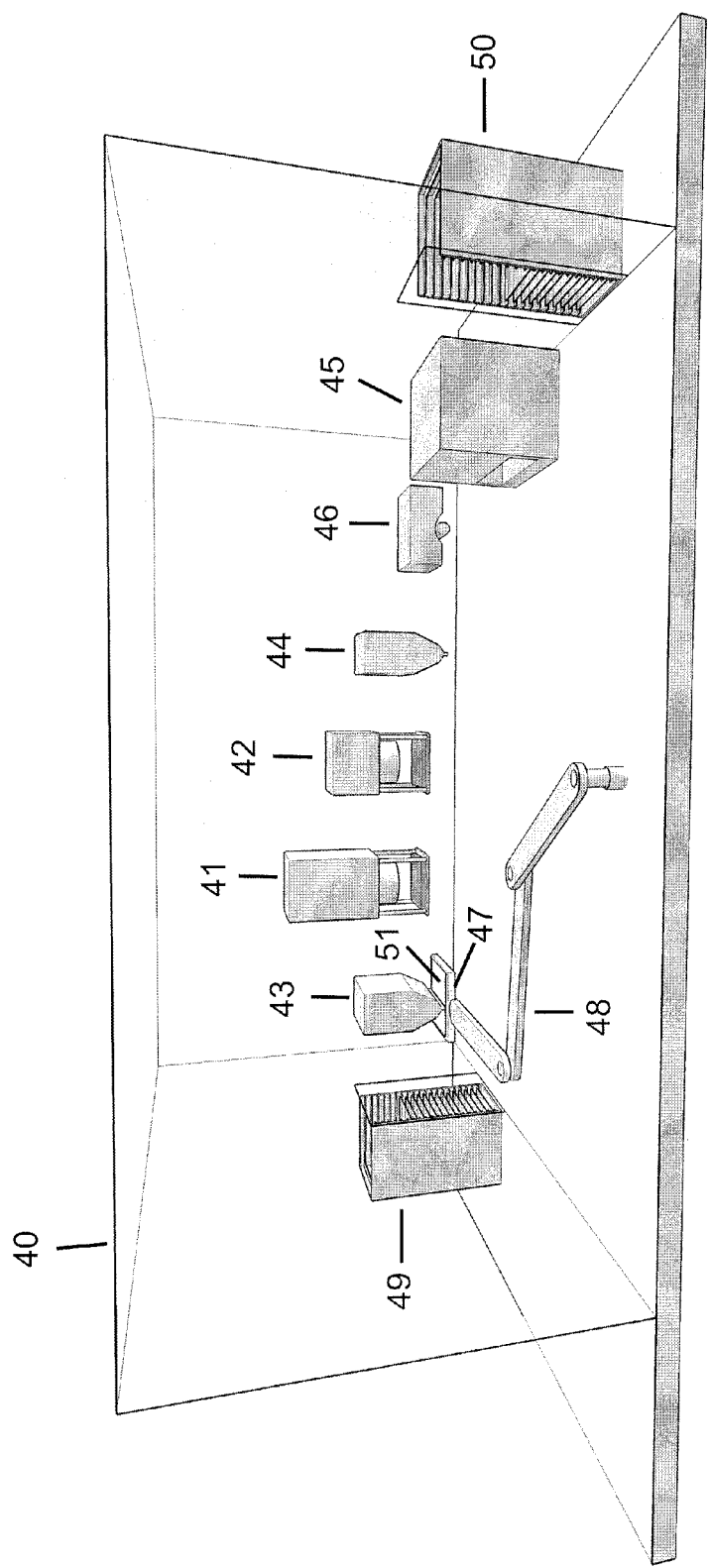
FIG. 4 shows an apparatus with a robotic arm, for automatic cassette to cassette production.

An example of an apparatus 40 with a robotic arm as a substrate handling system is shown in FIG. 4. It comprises a first coating or printing unit 43, a second coating or printing unit 44, an SLM exposure unit 41 providing spatially modulated aligning light with a first polarization plane, a polarized light source 42 providing aligning light with a second polarization plane, an oven 45, a curing unit 46, a support for a substrate 47, a robotic arm 48 and cassettes 49 and 50 for storing input and output substrates. The support 47, which is connected to the robotic arm 48, has means for picking up and fixing a substrate 51, which can, for example be done by vacuum applied through holes or channels. The robotic arm moves the support to the different processing units. The robotic arm as well as the different processing units is (are) computer controlled, so that fully automatic production of elements with individually patterned anisotropic properties can be done from cassette to cassette. For reasons of simplicity, the computer as well as electrical and mechanical connections is (are) not shown in the figure. The SLM exposure unit 41 may be any of the SLM exposure units described above. The polarized light source 42 provides aligning light with uniform light intensity, but with a different polarization plane as that of the aligning light provided by the SLM exposure unit 41. The curing unit 46 comprises a light source, providing actinic light for initiating a polymerization reaction in a slave material.

In an apparatus as illustrated in FIG. 4, the first coating or printing unit 43 may be used for applying a LCMO layer to a substrate, whereas the second coating or printing unit 44 may be used for coating or printing a slave material. After providing the substrates to be processed in cassette 49, an automatic production process could then, for example, be the following: picking up a substrate 51 from the cassette 49 with the support 47 connected to the robotic arm 48, moving the support with the substrate below the first coating or printing unit 43, coating a solution comprising a photo-alignable material to the substrate 51, positioning the support with the coated substrate in the oven 45 to remove the remaining solvent, moving the support with the substrate to the exposure unit 41, addressing the SLM in the exposure unit to provide a desired pattern, irradiating the LCMO layer on the substrate with the spatially modulated aligning light of the exposure unit, moving the support with the substrate to the polarized light source 42, exposing the LCMO layer to the aligning light of the polarized light source 42, moving the support to the second coating or printing unit 44, applying a slave material on top of the irradiated LCMO layer on the substrate, positioning the support with the substrate in the oven 45, move the support with the substrate to the curing unit and provide actinic light for initiating polymerization in the slave material. Depending on the type of the slave material, polymerization may have to be performed under inert atmosphere.

Figure 5:
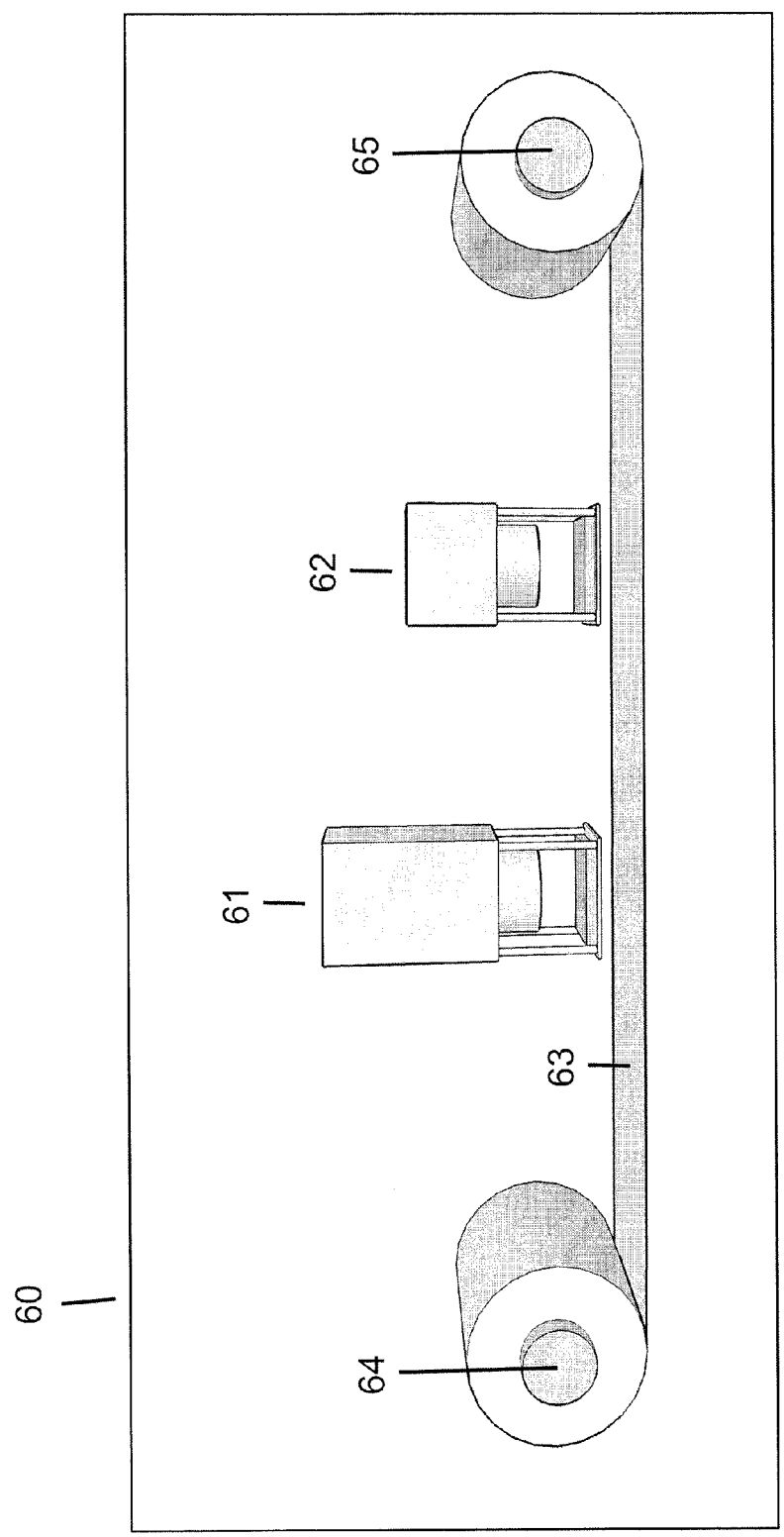
FIG. 5 shows an apparatus according to the invention for reel to reel production

FIG. 5 shows an example of an apparatus according to the invention, which is designed for sequential irradiation of a photo-alignable material in or on a flexible substrate with spatially modulated aligning light with a first polarization plane and with aligning light of a second polarization plane in a reel to reel production. The apparatus 60 of FIG. 5 comprises an SLM exposure unit 61, which provides spatially modulated aligning light with a first polarization plane, a polarized light source 62 providing aligning light with a second polarization plane and supports 64 and 65 for a substrate 63. The supports 64 and 65 are such that they can move a substrate from reel to reel. In a simple embodiment this is done manually, for example by rotating one or both supports using a crank. Preferably, one or both of the supports 64 and 65 are driven by a motor. The substrate may either be moved from support 64 to support 65 or in the opposite direction. Since the apparatus 60 does not comprise a coating unit, the substrate may comprise an LCMO layer, which for example has been pre-coated to the substrate, or the LCMO layer itself is formed as a substrate. The SLM exposure unit 61 may be any of the SLM exposure units described above. The polarized light source 62 provides aligning light with uniform light intensity, but with a different polarization plane compared to that of the aligning light provided by the SLM exposure unit 61, and does not need to comprise an SLM.

Figure 6:
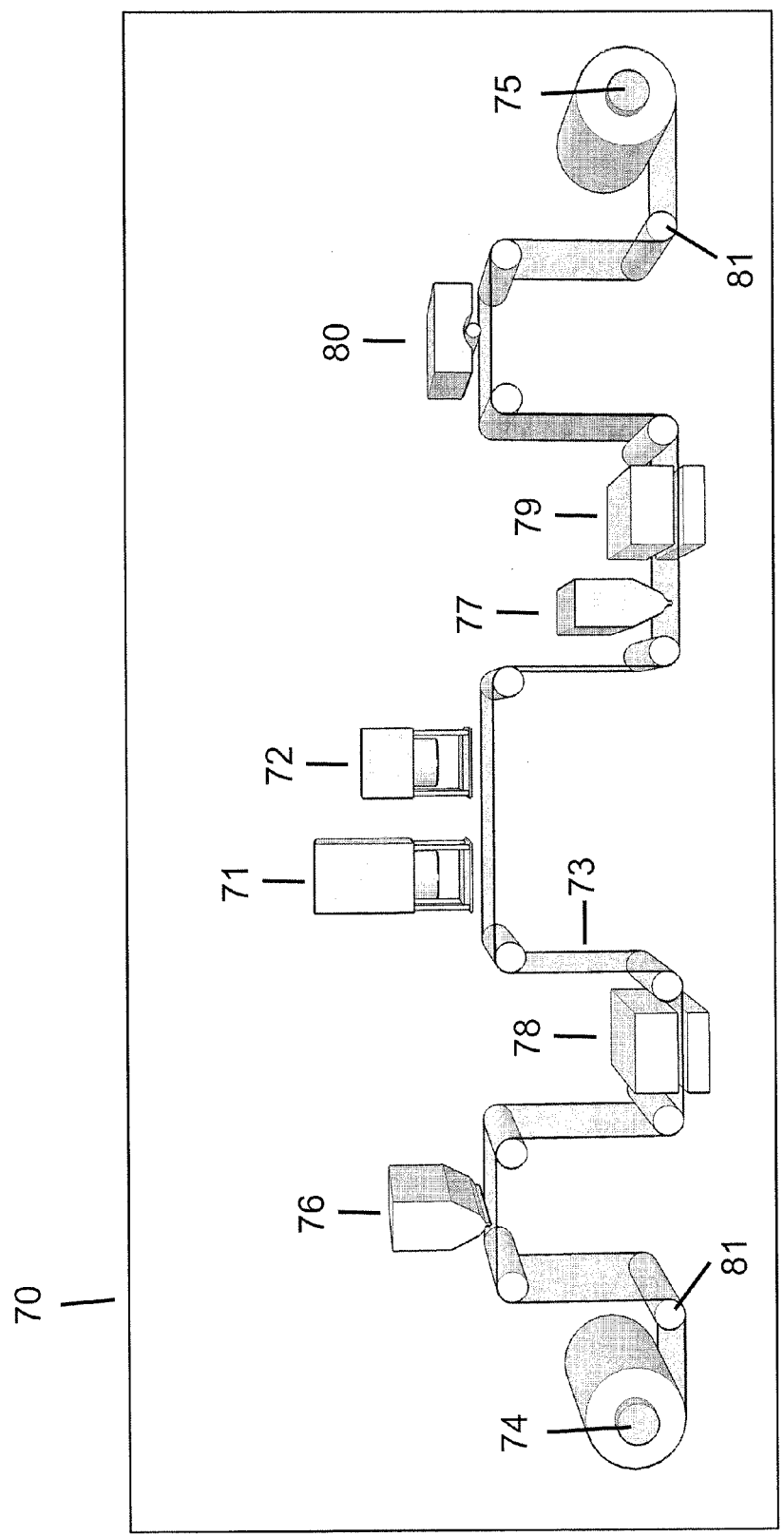
FIG. 6 shows an apparatus for reel to reel production, additionally equipped with coating units.

An apparatus for reel to reel production may comprise additional units, for example, a unit for coating or printing a photo-alignable material and/or a unit for coating or printing a slave material and optionally means for locally increasing the temperature of the substrate, such as an oven, an infrared heater or a warm air blower. FIG. 6 shows an example of an apparatus 70, still according to the invention, which comprises supports 74 and 75 for a substrate 73, a first coating or printing unit 76, an oven 78, an SLM exposure unit 71, which provides spatially modulated aligning light with a first polarization plane, a polarized light source 72 providing aligning light with a second polarization plane, a second coating or printing unit 77, an oven 79, a curing unit 80 and rolls 81 for guiding and supporting the flexible substrate to be processed. The SLM exposure unit 71 may be any of the exposure units described above. The polarized light source 72 provides aligning light with uniform light intensity, but with a different polarization plane compared to that of the aligning light provided by exposure unit 71. The curing unit 80 comprises a light source, providing actinic light for initiating polymerization in a slave material. The supports 74 and 75 are such that they can move a substrate from a reel on support 74 to a reel on support 75. Preferably, one or both of the supports 74 and 75 are driven by a motor. An apparatus 70 allows fully automatic production of elements with patterned anisotropic properties.

In an apparatus for reel to reel processing, such as for the examples of FIGS. 5 and 6, the substrate may either move continuously or may be stopped, at least at the position of exposure unit 61, 71 for irradiation with the spatially modulated aligning light. If the substrate moves continuously within the projection area of the exposure unit 61, 71, it may be important to take care that the pattern provided by the spatially modulated light is reproduced in the layer of the LCMO layer without motion blur. This can for example be done by providing the spatially modulated light as a flash, each time an area of the substrate to be irradiated with the pattern has approached the projection area of the SLM exposure unit, such that the pattern is reproduced in the LCMO layer within the short time of a single flash. Alternatively, the pattern provided by the SLM scrolls synchronously with the movement of the substrate. For this purpose the velocity of the substrate or the rotational speed of a support 64, 65, 74, 75 or of a guiding roll 81 can be monitored by appropriate means, to provide an electronic signal for controlling the scrolling pattern generation for the SLM. In a matrix type SLM, scrolling is preferably done line by line, which means that the SLM periodically moves the applied pattern by one line, such that the spatial modulation of the aligning light moves synchronously with the substrate.

Using an apparatus, such as that in FIG. 6, a process for the production of elements with individually patterned anisotropic properties may comprise the steps: providing a flexible substrate 73 in an apparatus for reel to reel production on a reel on support 74 and operate the apparatus such that the substrate moves and winds up on a reel on support 75, coating or printing a solution comprising a photo-alignable material to the substrate 73 with coating or printing unit 76, heating the substrate in oven 78 to remove the remaining solvent, address the SLM in the exposure unit 71 to provide a scrolling pattern of the individual information, such that the projected pattern moves within the projection area of the SLM exposure unit 71 with the same speed and direction as the substrate 73, irradiating the LCMO layer on the substrate with the spatially modulated aligning light of the first polarization plane from the exposure unit 71, irradiating the LCMO layer on the substrate with the aligning light of the second polarization plane from the polarized light source 72, coating or printing a slave material on top of the irradiated LCMO layer with coating or printing unit 77, optionally heating the substrate in the oven 79, initiating polymerization in the slave material by exposure to the actinic light of the curing unit 80 and wind up the processed substrate on a reel on support 75. Depending on the type of slave material, polymerization may have to be performed under inert atmosphere.

Figure 7:
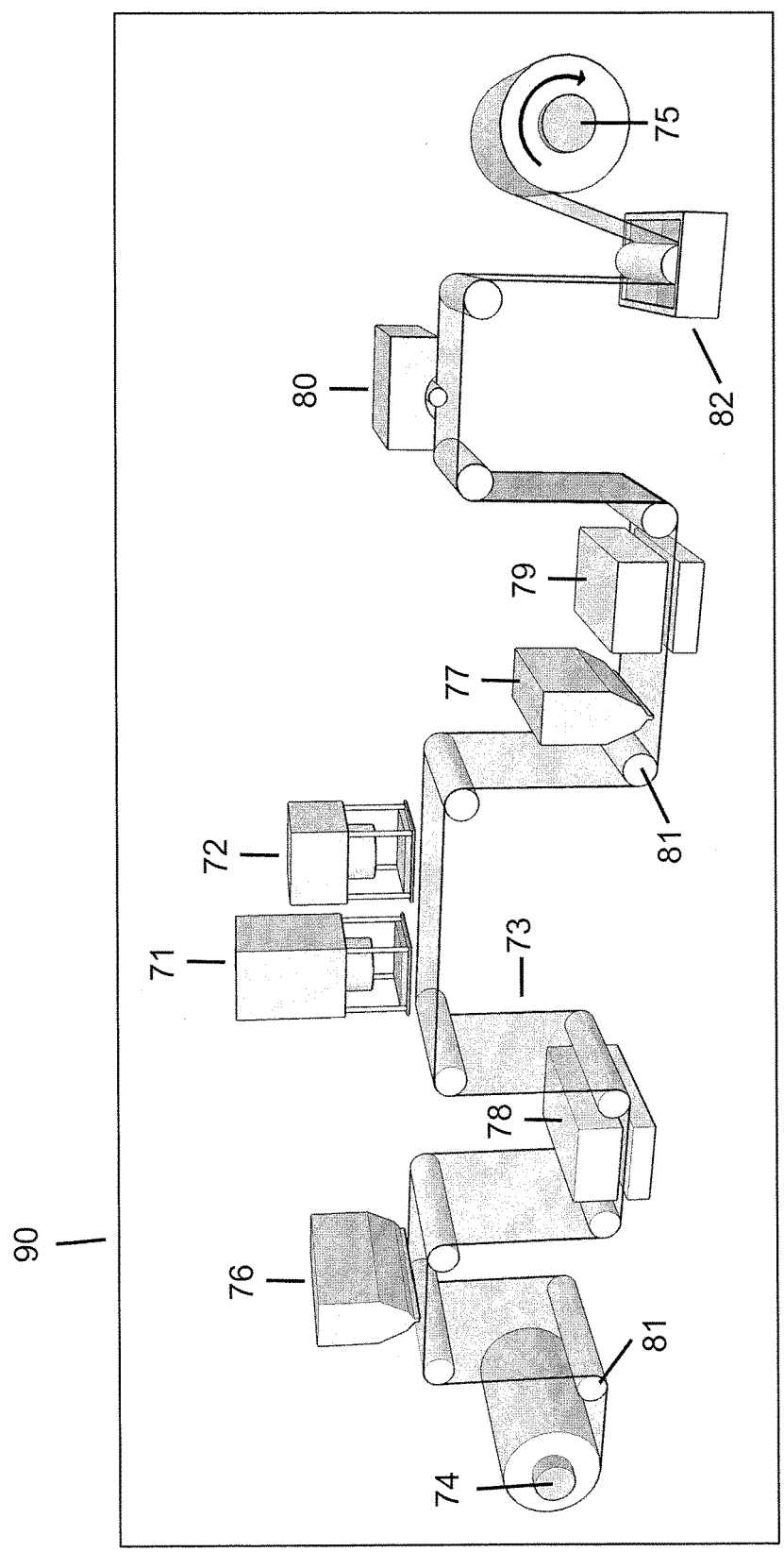
FIG. 7 shows an apparatus for reel to reel production, additionally equipped with a purging unit.

FIG. 7 shows an apparatus 90, which is a variant of the apparatus 70 of FIG. 6 and additionally comprises a purging unit 82, in which non-polymerized compounds may be removed from the processed layers. The purging unit typically contains a solvent, which is able to dissolve the non-polymerized compounds.

Since the LCMO layer may either be first exposed to the spatially modulated aligning light of the SLM exposure unit 61, 71 and then exposed to the aligning light of a second polarization plane from the polarized light source 62, 72, the sequential arrangement of the SLM exposure unit 61, 71 and of the polarized light source 62, 72, with regard to the direction of the substrate movement, may be interchanged.

Whereas the apparatus in the example of FIG. 5 is designed just for the reel to reel generation of individual patterns in a pre-prepared LCMO layer and the apparatus of FIG. 6 allows to automatically produce elements with individually patterned anisotropic properties, including the required coating steps, a reel to reel production apparatus according to the invention may only include one coating step. For example, the apparatus may comprise the coating unit 76 and the oven 78 for applying a layer comprising a photo-alignable material, but none of coating unit 77, oven 79 and curing unit 80. With such an apparatus the LCMO layer can be applied and the individual pattern can be generated in the LCMO layer. An optional layer of a slave material would then have to be coated and optionally polymerized in a separate apparatus. Likewise, a reel to reel apparatus according to the invention may comprise coating unit 77, oven 79 and curing unit 80 for generating a layer of a slave material on top of the irradiated LCMO layer. For use in such an apparatus a substrate may be pre-coated with an LCMO layer or the LCMO layer may be formed as a substrate. After generating the required orientation pattern by exposure to the SLM exposure unit 71 and the polarized light source 72, the slave material is coated or printed with the coating or printing unit 77, dried and oriented in oven 79 and polymerized in curing unit 80, which results in the desired elements with individually patterned anisotropic properties.

An apparatus according to any of the above embodiments may comprise further units, such as, for example, means for printing permanent information or means for laminating elements produced in the apparatus to other substrates or devices.

An apparatus according to the invention shall not be restricted to certain embodiments, such as certain combinations of units. Rather than that, the different types of exposure units, coating or printing units, heating stages, actinic light sources, support for the substrate and the substrate handling system can be combined in an apparatus at will.

The present invention furthermore relates to a method for fast production of elements with individually patterned anisotropic properties. The method according to the invention comprises the steps providing an LCMO layer and exposing the LCMO layer to the spatially modulated aligning light of an SLM exposure unit, having a first polarization plane.

The LCMO layer may be applied by coating and/or printing and may be provided over the entire area of the substrate or only on parts of it.

If in the methods as described above the LCMO layer has not been subjected to further alignment treatment, the LCMO layer exhibits anisotropic properties only in those areas, which were exposed to aligning light. Accordingly, a slave material either included in the LCMO layer or on top of it will establish anisotropic properties due to contact with the LCMO material only in those areas of the LCMO layer, which were exposed to aligning light, whereas outside those areas no anisotropic properties will be created. If an LCP material is used as a slave material, an element with patterned anisotropic properties produced in this way therefore comprises areas wherein the liquid crystal material is aligned and areas wherein the liquid crystal material is not aligned. A pattern generated in this way can be seen in polarized light.

The SLM may be addressed such that each of the pixels are either in the on or in the off state, which has the consequence that the spatial variation of the aligning light is such that the intensity has either the lowest or highest level. Such an SLM-addressing scheme is referred to as digital addressing in the following. Alternatively, it is possible to address pixels to intermediate states between the on and off state, which has the consequence that the spatial variation of the aligning light includes also grey levels. Such an SLM-addressing scheme is referred to as grey scale addressing in the following.

In a preferred method of the invention digital addressing is used as the SLM-addressing scheme. In another preferred method of the invention grey scale addressing is used as the SLM-addressing scheme.

In a preferred method, the LCMO layer is additionally exposed to aligning with a second polarization plane, either before or after exposure to the spatially modulated aligning light of the first polarization plane. The aligning light of the second polarization plane may be provided only for those areas which are not to be irradiated with the aligning light of the first polarization plane. This can, for example, be done by providing the aligning light of the second polarization plane also by an SLM exposure unit.

Alternatively, the two exposure steps may be such that at least some areas of the LCMO layer are sequentially exposed to aligning light of the first and second polarization plane, in either sequence. This can, for example, be done by exposing the LCMO layer to the aligning light of a polarized light source, either before or after exposure to the spatially modulated aligning light of the SLM exposure unit.

In another preferred method, the LCMO layer is exposed to aligning with multiple polarization planes. The aligning light of the second and further polarization planes may be provided only for those areas which have not yet been irradiated with aligning light. Preferably this is done by providing the aligning light of the second and/or further polarization planes also by an SLM exposure unit.

Depending on the nature of the photo-alignable material, the spectral intensity distribution and the exposure doses of the aligning light, the resulting local alignment direction in areas exposed to aligning light of two or more polarization planes may be different from the alignment direction created in areas, which are only exposed to either of the polarization planes of the aligning light. It is therefore possible to control the resulting alignment direction in double or multiple exposed areas by the local exposure dose in the first, second or additional exposure steps.

According to a preferred method of the invention, grey scale addressing is used as the SLM-addressing scheme for irradiation with aligning light with the first polarization plane and the LCMO layer is exposed to aligning light with a second polarization plane, such that there are areas which have been exposed to the aligning light of the first and second polarization plane and for which the exposure doses for aligning light of the first polarization plane have been different from each other.

In a preferred method the aligning light of the second polarization plane is also provided by an SLM exposure unit in which grey scale addressing is used. The same SLM exposure unit may be used for providing spatially modulated light of the first and second polarization plane. According to a preferred variant of this method, the addressing of the SLM is such that the projected SLM light with the first polarization plane represents at least in a certain area a grey scale pattern on the LCMO layer and the projected SLM light of the second polarization plane represents the same pattern at the same location on the LCMO layer but with a different gradient of grey scale intensities. In the terminology used in photography the grey scale pattern projected with the second polarization plane is the same pattern as that projected with the first polarization plane, but is gamma corrected. In a preferred variant of the method, gamma correction is such that the grey scales of the pattern projected with the second polarization plane are inversed compared to the grey scales of the pattern projected with the first polarization plane. This corresponds to projecting a grey scale image and the negative of it to the same area of an LCMO layer, whereas the polarization planes of the aligning light for the image and the negative image are different from each other.

In the above described methods the SLM exposure unit and the substrate may keep their relative position to each other during irradiation of the LCMO layer or the SLM exposure unit and the substrate may move relative to each other. For example, the method can be used in a reel to reel production apparatus as described above, wherein the substrate moves during irradiation. Another example is that the SLM exposure unit moves continuously over a fixed substrate during irradiation. For the case that the SLM exposure unit and the substrate move relative to each other, also the projection area of the SLM exposure unit and the substrate move relative to each other, accordingly. In a preferred method according to the invention, the projection area of the SLM exposure unit moves relative to the substrate during exposure of the LCMO layer to the aligning light of the SLM exposure unit and the SLM is addressed such that the pattern to be projected to the LCMO layer scrolls across the pixels of the SLM. Preferably, the SLM comprises pixels arranged in a matrix, which form lines of rows and columns, and the pattern is scrolled line by line. For example, the lines are formed by the rows of the SLM and the pattern to be displayed is shifted by one row periodically. Upon shifting, the content of the first row is moved to the second row, the content of the second row is moved to the third row and so on. The content of the last row may be shifted to the first row again, if the same image is to be reproduced again. If alternate images are to be reproduced, the first row of the SLM will display the corresponding line of that image.

Because of scrolling, the projected pattern moves within the projection area of the SLM exposure unit. The scrolling velocity is chosen such as to reduce the relative velocity between the projected pattern and the substrate. Ideally, the scrolling speed is such that each part of the projected pattern maintains its position on the substrate, as long as being projected.

Like for the case where SLM exposure and substrate does not move during irradiation, the scrolling method may be modified to provide spatially modulated aligning light of two or more polarization planes. For example, the polarization plane of the spatially modulated aligning light may sequentially be set to different values within the time frame for scrolling of a pattern. Any means to provide light with different polarization planes with a single SLM exposure unit, as described above, may be used for that purpose. Preferably the change of the polarization plane is controlled automatically and is synchronized with the scrolling scheme. In a preferred variant of the method, the pattern to be projected is a grey scale pattern and the pattern provided by the SLM is periodically inversed, in order to alternately provide a positive and the negative image, as described above, synchronously with switching the polarization plane of the aligning light between two values.

For synchronizing the scrolling speed with the velocity of the substrate, appropriate monitoring means can be used, which measure the substrate velocity and provide a signal, which is suitable to trigger the scrolling algorithm for the SLM addressing.

As long as it is only desired to generate anisotropic properties without a preferred direction out of the plane of the substrate, the average incidence direction of the aligning light is typically normal to the substrate. For generation of anisotropic properties with a preferred direction out of the plane, such as a tilt angle for aligning a slave material, for example a liquid crystal material, it is preferred to irradiate the LCMO layer with obliquely incident light. This could be the aligning light of the SLM exposure unit with the first polarization plane and/or the aligning light of a further exposure step, either spatially modulated or non-modulated, or it may be non-polarized actinic light. For example it is possible to generate an element with patterned tilted anisotropic properties by exposure of the LCMO layer to the vertically incident modulated aligning light of an SLM exposure unit and in addition to obliquely incident non-modulated aligning light with the same or different polarization plane or even to obliquely incident non-modulated, non-polarized actinic light. Exposure to the vertically and oblique incident light may be in either sequence and could be done also simultaneously. In another variant of the method, the same area of an LCMO layer is exposed to the spatially modulated aligning light of two SLM exposure units, of which at least one irradiates aligning light obliquely to the surface of the LCMO layer. If both of the two SLM exposure units irradiate aligning light obliquely to the surface of the LCMO layer, then the incidence planes defined by the light rays emitted from the two SLM exposure units may be coplanar or intersect. Likewise, the corresponding polarization planes may be identical or different.

A photo-alignable material in an LCMO layer for any of the methods described above may be any kind of photo-sensitive material in which anisotropic properties can be created upon exposure to aligning light, independent from the photo-reaction mechanism. Therefore, suitable photo-alignable materials are, for example, materials in which upon exposure to aligning light the anisotropy is induced by photo-dimerization, photo-decomposition, trans-cis transition or photo-Fries rearrangement. Preferred photo-alignable materials are those, in which upon exposure to aligning light the created anisotropy is such that slave materials in contact with the photo-aligned material can be oriented. Preferably, such slave material is a liquid crystal material, in particular a LCP-material.

Photo-alignable materials, as those described above, incorporate photo-alignable moieties, which are capable of developing a preferred direction upon exposure to aligning light and thus creating anisotropic properties. Such photo-alignable moieties preferably have anisotropic absorption properties. Typically, such moieties exhibit absorption within the wavelength range from 230 to 500 nm. Preferably, the photo-alignable moieties exhibit absorption of light in the wavelength range from 300 to 450 nm, more preferred are moieties, which exhibit absorption in the wavelength range from 350 to 420 nm and most preferred are moieties, which exhibit absorption in the wavelength range from 380 to 410 nm.

Preferably the photo-alignable moieties have carbon-carbon, carbon-nitrogen, or nitrogen-nitrogen double bonds.

For example, photo-alignable moieties are substituted or un-substituted azo dyes, anthraquinone, coumarin, mericyanine, methane, 2-phenylazothiazole, 2-phenylazobenzthiazole, stilbene, cyanostilbene, chalcone, cinnamate, stilbazolium, 1,4-bis(2-phenylethylenyl)benzene, 4,4'-bis(arylazo) stilbenes, perylene, 4,8-diamino-1,5-naphthoquinone dyes, diaryl ketones, having a ketone moiety or ketone derivative in conjugation with two aromatic rings, such as for example substituted benzophenones, benzophenone imines, phenylhydrazones, and semicarbazones.

Preparation of the anisotropically absorbing materials listed above are well known as shown, e.g., by Hoffman et al., in U.S. Pat. No. 4,565,424, Jones et al., in U.S. Pat. No. 4,401,369, Cole, Jr.et al., in U.S. Pat. No. 4,122,027, Etzbach et al., in U.S. Pat. No. 4,667,020, and Shannon et al., in U.S. Pat. No. 5,389,285.

Preferably, the photo-alignable moieties comprise arylazo, poly(arylazo), stilbene, cyanostilbene, cinnamate or chalcone.

A photo-alignable material may have the form of a monomer, oligomer or polymer. The photo-alignable moieties can be covalently bonded within the main chain or within a side chain of a polymer or oligomer or they may be part of a monomer.

Polymers denotes for example to polyacrylate, polymethacrylate, polyimide, polyamic acids, polymaleinimide, poly-2-chloroacrylate, poly-2-phenylacrylate; unsubstituted or with $C_1$-$C_6$alkyl substituted poylacrylamide, polymethacrylamide, poly-2-chloroacrylamide, poly-2-phenylacrylamide, polyvinylether, polyvinylester, polystyrene-derivatives, polysiloxane, straight-chain or branched alkyl esters of polyacrylic or polymethacrylic acids; polyphenoxyalkylacrylates, polyphenoxyalkylmethacrylates, polyphenylalkylmethacrylates, with alkyl residues of 1-20 carbon atoms; polyacrylnitril, polymethacrylnitril, polystyrene, poly-4-methylstyrene or mixtures thereof.

A photo-alignable material may also be a composition comprising compounds with different types of photo-alignable moieties. For example, the wavelength of maximum absorption may be different for the different photo-alignable moieties. A preferred composition comprises compounds with photo-alignable moieties, which are mainly reactive for light in the UV-A wavelength range and compounds with photo-alignable moieties, which are mainly reactive for light in the UV-B wavelength range. A photo-alignable material may also be a composition comprising compounds having photo-alignable moieties and a photo-sensitizer. Suitable photo-sensitizers are, for example, ketocoumarines and benzophenones.

Further, preferred photo-alignable monomers or oligomers or polymers are described in U.S. Pat. Nos. 5,539,074, 6,201,087, 6,107,427, 6,632,909 and 7,959,990.

In order to select preferred photo-alignable materials for the methods of the present invention, the LCMO layer, which comprises photo-alignable materials, may be characterized by its absorption coefficient $\alpha(\lambda)$, wherein the absorption is related to a photo-reaction mechanism, which can induce anisotropy in the LCMO layer. The absorption coefficient $\alpha(\lambda)$ is defined as usually and can be derived from the absorption $A(\lambda)$ of a non-irradiated LCMO layer according to Lambert's law:

$$\alpha(\lambda) = \frac{A(\lambda)*0.2303}{L},$$

wherein L is the thickness of the LCMO layer and $\lambda$ is the wavelength of the light for which the absorption is measured. The absorption A is determined from the intensities of incident and transmitted light $I_0$ and $I_t$, respectively, as:

$$A(\lambda) = -\log_{10}\left(\frac{I_t(\lambda)}{I_0(\lambda)},\right)$$

For the methods of the present invention it is preferred that within the wavelength range from 350 nm to 420 nm there is at least one wavelength for which an LCMO layer has an absorption coefficient larger than 200 [1/cm], more preferred larger than 2000 [1/cm] and most preferred larger than 20000 [1/cm]. It is even more preferred that within the wavelength range from 380 nm to 410 nm there is at least one wavelength for which an LCMO layer has an absorption coefficient larger than 200 [1/cm], more preferred larger than 2000 [1/cm] and most preferred larger than 20000 [1/cm].

An LCMO layer as used in any of the above methods may comprise a slave material, in which anisotropy can be created by contact with the photo-alignable material. Preferably, the slave material is an LCP material. A method using an LCMO layer containing a slave material preferably comprises the step of heating the LCMO layer during and/or after exposure to the aligning light. The method may also comprise initiating polymerization in the slave material by thermal treatment or exposure to actinic light.

In a preferred variant of the methods described above, a slave material is applied on top of the irradiated LCMO layer in an additional step. Preferably, the slave material is an LCP material. The slave material may be applied by coating and/or printing and may be applied over the full substrate area or only on parts of it. The slave material shall cover at least parts of the LCMO layer but does not have to be applied over the entire area of it. Preferably, the method involves heating the layer of the slave material. The method may also comprise initiating polymerization in the slave material by thermal treatment or exposure to actinic light. Depending on the nature of the slave material, it may be helpful to perform the polymerization under inert atmosphere, such as nitrogen or vacuum.

If a slave material is included in the LCMO layer or applied on top of it, above methods may further comprise an additional step of removing non-polymerized materials from the slave material, for example by evaporation or dissolving in a solvent, in order to generate microstructures in the remaining layer. The slave material to be used in such a method may be designed such that phase separation of polymerized and non-polymerized material occurs upon initiating polymerization. For example, the slave material may comprise non-polymerizable liquid crystals.

The slave material may contain isotropic or anisotropic dyes and/or fluorescent dyes.

The methods described above may comprise additional steps, wherein additional layers are coated either underneath the LCMO layer and/or above the LCMO layer and/or above a slave material. The steps of the above methods may also be repeated in order to apply such layers in a stack either on one and/or on both sides of a substrate.

The substrate may be rigid or flexible. Further it may be translucent or opaque and may be tinted. Typical materials for substrates are glass, plastic, paper or metal. It is also possible that the substrate itself comprises photo-alignable materials. In the latter case, the substrate itself is an LCMO layer and no additional substrate may be required. The substrate may comprise one or more layers, such as a reflective layer, a layer containing dyes or a dielectric layer. For reel to reel production it is preferred that the substrate is a flexible polymer foil.

The methods described above may further comprise an additional step, wherein an element produced with any of the above methods is laminated to another substrate, device or product. The other substrate may, for example, be part of a security device or any kind of identity card, payment card or banknote.

By applying the above methods, generation of individual and/or complex patterned anisotropic properties in an LCMO layer as well as in a slave material due to contact with the photo-aligned material of the LCMO layer is feasible. Such layers and/or layer structures are preferably used in optical and electro-optical elements. For example, an LCMO layer prepared according to the above methods can be used as an orientation layer for liquid crystals in an LCD in order to provide multiple orientation directions.

Preferably, above methods are used to produce structured optically anisotropic elements with locally different directions of the preferred axis. The optical anisotropy may refer to different optical properties. For example, optical anisotropy can refer to absorption of light, which results in a patterned polarizer with locally different polarization axes. Anisotropic absorption properties may be achieved by a LCP slave material containing anisotropic absorbing dyes. Optical anisotropy can also refer to the index of refraction, which results in a birefringent element with locally different optical axes. Birefringence may be achieved in a LCP slave material. Optical anisotropy may, for example, also refer to fluorescence. Anisotropic fluorescence properties may be achieved by a LCP slave material containing anisotropically absorbing and/or anisotropically fluorescing dyes. Optical anisotropy may also refer to scattering. An optical element exhibiting anisotropic scattering may be achieved by dissolving non-polymerized material from an oriented slave material. Structured optically anisotropic elements may, for example, be used as optical security elements.

Of specific interest are elements with high complexity, typically having a multitude of directions of the preferred axis in different regions. For example, an element may comprise two or more patterns or images, which are not all visible at the same time, but can be made alternately visible by rotating or tilting the element or rotating a polarizer used for observation. In another example, the preferred axis directions may vary locally such that an impression of a moving image can be created by rotating or tilting the element or rotating a polarizer used for observation.

Further, such optically anisotropic elements may be used in optical applications to generate polarized light with spatial variation of the polarization plane or to locally modify the polarization state of polarized light. For example, a patterned birefringent element with locally different optical axis direction can be used as a polarization converter mask, which locally modifies the polarization plane of incident polarized light in order to provide aligning light with a spatial variation of the polarization plane for irradiation of an LCMO layer.

APPLICATION EXAMPLE 1 (BATCH PROCESSING)

A solution S(PA) is prepared by dissolving 3 wt % of the photo-alignable polymer P in a solvent mixture consisting of 97 wt % MEK and 3 wt % CHN.

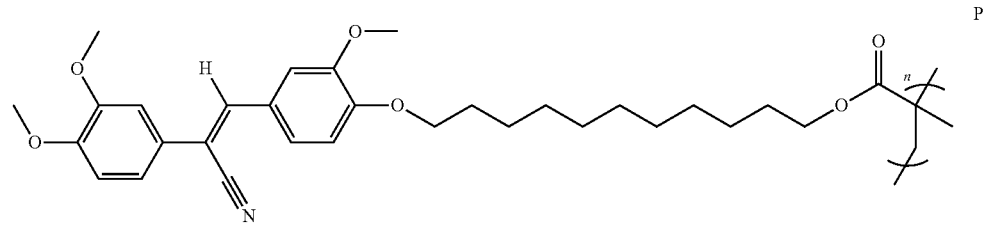

The absorption coefficient α(390 nm) has been determined as 90500 [1/cm].

A LCP-solution S1(LCP) is prepared by dissolving 15% by weight of mixture $M_{LCP}$ in a solvent mixture consisting of 97 wt % MEK and 3 wt % CHN.
Mixture $M_{LCP}$ comprises polymerizable liquid crystals and consists of:
76.4% LC1
14.3% LC2
4.8% LC3
4% Irgacure 907
0.5% BHT underneath the ink jet head, such that a uniform wet film of S(PA) with an area of 6 cm×10 cm is coated on top of the aluminised PET foil. The table with the coated foil is then moved under the IR lamp for evaporation of the solvents. This results in a uniform solid LCMO layer of about 50 nm thickness. The table is now moved under the SLM exposure unit. Because the area of the substrate and of the LCMO layer has been chosen larger than the maximum size of a DMD image, multiple images can subsequently be projected side by side.

A first binary image is projected onto a first area of the LCMO layer with a resolution of 13 μm and with a UV

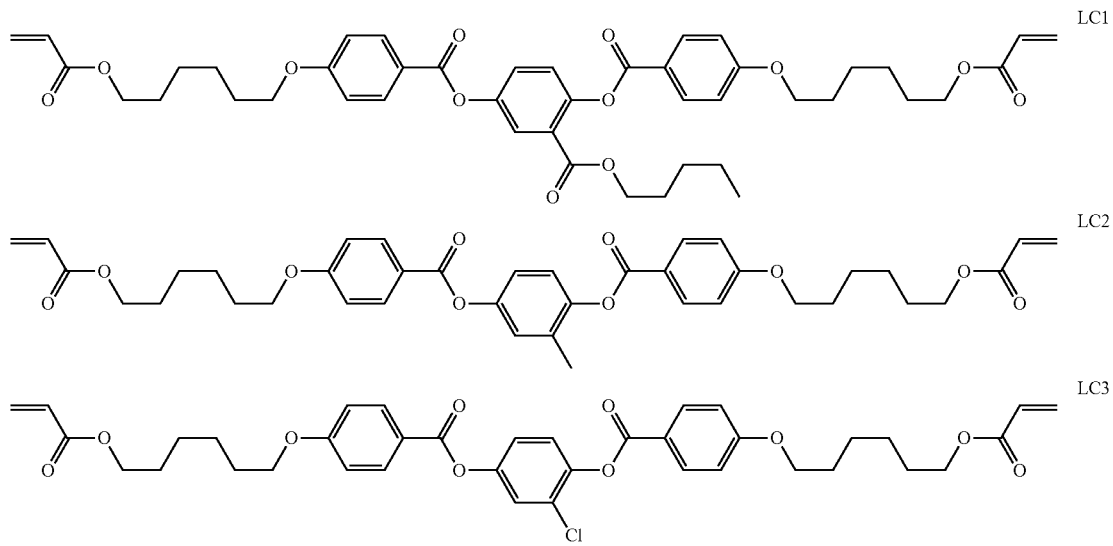

The apparatus for processing according to this application example comprises
- a first ink jet head comprising 16 nozzles of 18 μm diameter (REA Jet). The first ink jet head provides the solution S(PA),
- a 150 W IR lamp as a heater,
- an SLM exposure unit, which comprises a 0.7 inch diagonal DMD with 768×1024 micro mirrors (Texas Instruments) and a high power LED as a light source, which emits light at 390 nm. The exposure unit further contains a projection lens and a uv-transmissive linear polarizer (Moxtek) with a polarization contrast of about 200:1 at 390 nm wavelength. The polarizer is located behind the projection lens when viewed along the path of the SLM light and is mounted on a motorised rotation stage, which is computer controlled. The optics of the SLM exposure unit is such that it generates a 1:1 image of the pattern provided by the DMD,
- a second ink jet head, which provides LCP-solution S1(LCP),
- a high power UV LED lamp (Phonox) providing light of 390 nm wavelength as a curing unit,
- a movable support table mounted on an x, y translation stage, which is motorised and controllable by a computer, such that the support table can be automatically moved to each of the processing units above.

A 7 cm×12 cm, 23 μm thick sheet of a PET foil with an aluminised surface is taped on top of the support table. Then the support table is moved to a starting position at the first ink jet head and is then moved at a speed of 50 m/min energy density of 20 mJ/cm², which corresponds to an exposure time of 0.1 s. After the first irradiation the polarizer is turned by 45° and the inverse of the first image is projected using the same irradiation parameters as that of the first irradiation, without moving the substrate. Accordingly, a latent image has been created, which consists of different regions within the first area of the LCMO layer, which have been irradiated with equal exposure energies but with two different polarisation directions, namely 0° and 45°.

The support with the LCMO coated foil is now moved to another position underneath the SLM exposure unit, such that the exposure area of the exposure unit fits with an area of the LCMO layer, which has not been exposed yet. A second image and the inverse image thereof are exposed in the same way as described above for the first image. The irradiation process is repeated by projecting additional images to different areas of the LCMO layer to generate a set of 18 different latent images arranged in a 3×6 matrix.

The table is then moved underneath the second ink jet head, such that a layer of the LCP-solution S1(LCP) is coated on top of the LCMO layer.

The table with the foil is subsequently moved underneath the IR lamp for evaporating the solvent and at the same time annealing the liquid crystal monomers to orientate the molecules according the orientation information provided by the underlying LCMO layer. Then the table with the foil is moved underneath a high power UV LED lamp (390 nm light) for initiating polymerization of the liquid crystal monomers. The thickness of the resulting solid LCP film is 1100 nm and has an optical retardation of 140 nm, corresponding to a quarter wave retarder. The resulting layer structure comprises 18 different birefringent latent images, which are invisible with the naked eye. However, when viewed with a linear polarizer, the images appear with positive contrast if the polarizer is oriented parallel to the optical axis of the LCP film in the areas of the first irradiation and the images are seen with negative contrast when the polarizer is turned by 45°.

APPLICATION EXAMPLE 2 (REEL TO REEL PROCESSING)

This example describes reel to reel processing, demonstrating the manufacture of individualized highly resolved images in a continuous manufacturing process.

A LCP-solution S2(LCP) is prepared by dissolving 30% by weight of mixture $M_{LCP}$ in a solvent mixture consisting of 97 wt % MEK and 3 wt % CHN.

The apparatus used in this example is a modified version of that of FIG. 6, since it is not equipped with the second coating unit 77, the second heating unit 79 and the curing unit 80. In addition to the embodiment of FIG. 6, the apparatus is equipped with a corona treating unit, positioned between the support 74 and the coating unit 76. The coating unit is of the type reverse kiss coating.

The same type of exposure unit 71 is used as described in application example 1 above. A 23 μm thick aluminised PET foil is used as a substrate, which continuously moves at a web speed of 5 m/min from support 74 to support 75. Accordingly, the substrate first passes the corona treating unit before it arrives at the coating unit, where a uniform wet film of solution S(PA) is coated on the aluminum side of the PET substrate. The wet film is then dried at 90° C. in a hot air oven of 3 m length, which yields a solid LCMO layer of about 50 nm thickness. The substrate moves further to the SLM-exposure unit 71, which is similar to that described in application example 1. To compensate for the moving substrate during exposure, projection of the images is done using the scrolling mode. For this purpose, the apparatus includes a synchronizing unit, which generates a trigger pulse chain with a frequency, which is proportional to the speed of the moving substrate. The scrolling speed of the DMD is equalised with the momentary web speed via an adjustable frequency multiplier. In this way the projected image of the exposure unit and the substrate move at the same speed. Slow speed changes of the web are instantly compensated by the synchronizing unit. The DMD memory has been loaded with 100 individual binary images of 768×1024 pixels which are provided in a continuous loop. Irradiation is done using the scrolling mode with the polarization plane of the aligning light parallel to the moving direction (0°) of the web.

Having passed the SLM exposure unit, the LCMO layer on the substrate is exposed to the aligning light of the polarized light source 72. The polarized light source 72 comprises a mercury lamp (GEW) and is equipped with a polarizer (Moxtek). The polarization plane is set at 45° with respect to the moving direction of the web. The aligning light of the polarized light source 72 is not spatially modulated, but is uniform across the whole image area. The irradiation energy for aligning light from the polarized light source 72 is chosen as half of that of the spatially modulated aligning light from the SLM-exposure unit 71. The substrate is then wound up on a reel on support 75.

The LCMO coated and irradiated substrate is subsequently rewound and then mounted on support 74 for a second coating using the same machine, but with some modifications: The corona treater is not active, the SLM exposure unit 71 is switched off, the polarizer of exposure unit 72 is removed in order to provide non-polarized light, and the coating unit is provided with LCP solution S2(LCP). For the LCP coating step the substrate again moves from support 74 to support 75, thereby a layer of LCP solution S2(LCP) is applied by the coating unit on top of the LCMO layer. The wet film is then dried in oven 78 at a temperature of about 56° C. and at the same time the LCP monomers orientate in accordance with the underlying structured LCMO layer. The liquid crystal monomers are then fixed by initiating cross-linking with uniform non-polarised UVA light from exposure unit 72. The processed foil is finally wound up on a reel on support 75. The solid LCP film has a thickness of about 1100 nm and has an optical retardation corresponding to a quarter wave retarder for visible light.

As in application example 1, the birefringent latent images are invisible with the naked eye. However, when viewed with a linear polarizer, the images appear with positive contrast when the polarizer is oriented parallel to the optical axis of the LCP film in the areas of the first irradiation and the images are seen with negative contrast when the polarizer is turned by 45°.

APPLICATION EXAMPLE 3

Figure 8:
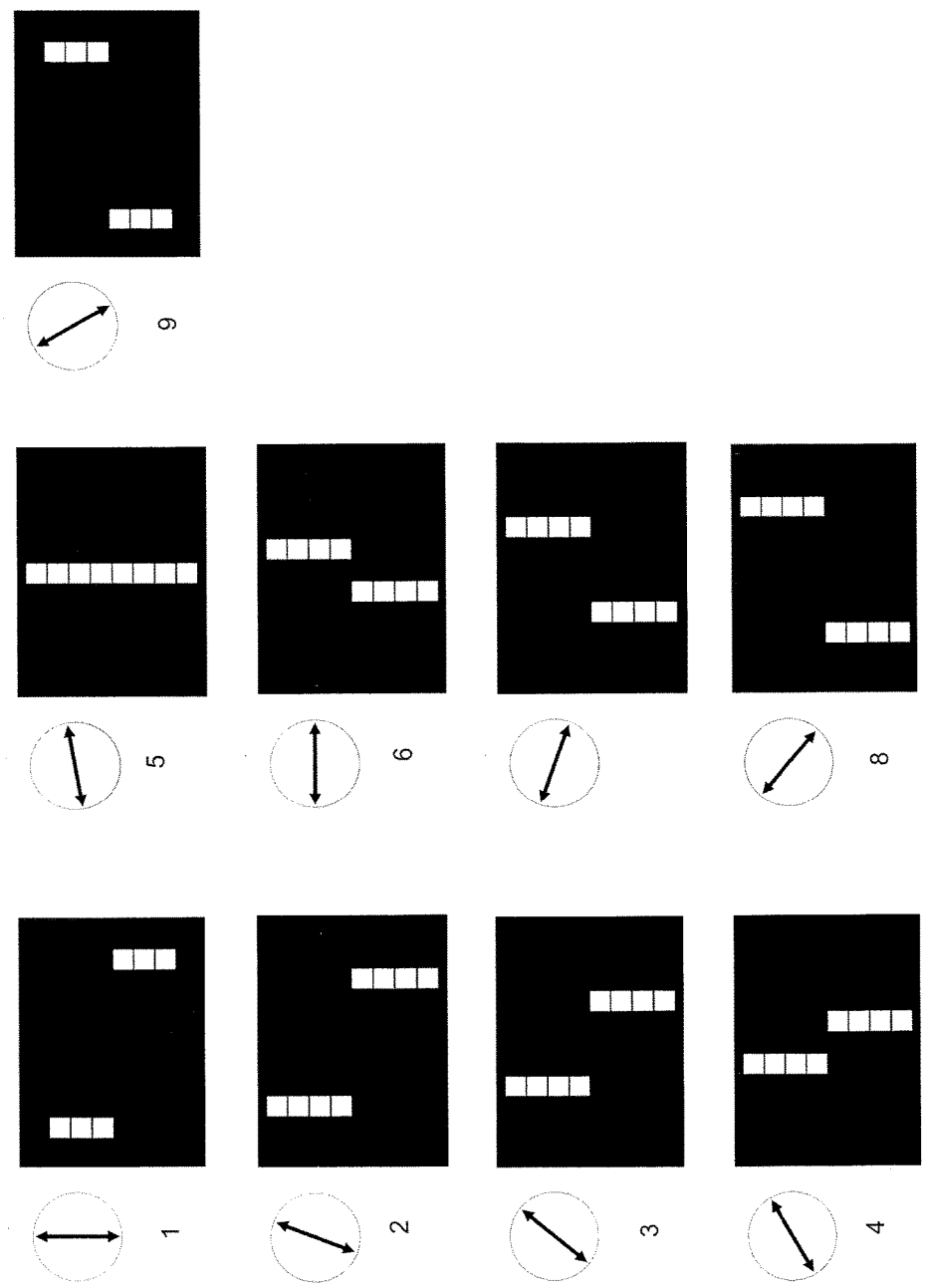
FIG. 8 shows example patterns for generating a moving image effect.

The same apparatus is used as described in application example 1. As in application example 1, an aluminised PET foil is coated with a layer of S(PA) and dried under the IR lamp. The sample is then moved under the SLM exposure unit. This time the image to be projected consists of 9 binary sub-images, as shown in FIG. 8. Each sub-image comprises 2 bright pixel-columns, while the remaining area is dark. The positions of the bright columns change from sub-image to sub-image. The set of sub-images is designed in such a way that the bright areas are not overlapping and that the sequential exposure of the whole set of images exposes the complete projection area. Furthermore the azimuthal direction of polarization is changed from exposure to exposure by turning the polarizer by 15° after each exposure as indicated by the arrows in FIG. 8.

After this multiple exposure, an LCP layer is coated on top the LCMO layer and dried and cured as described in application example 1.

The result is a structured birefringent LCP layer, non-visible with the naked eye but well recognizable when viewed with a linear polarizer. The columns appear showing varying gray levels, depending on the angle between polarization plane and optical axis of the birefringent column. When the polarizer is turned the individual gray levels change, generating the impression of a moving image.

It should be understood that the intention is not to limit the invention to particular embodiments described. On the contrary, the intention is to cover all modifications, equivalents, and alternatives falling within the spirit and scope of the invention.

The invention claimed is:

1. Apparatus for the production of elements with individually patterned anisotropic property, comprising
  a support for a substrate and
  an exposure unit for providing spatially intensity modulated aligning light with a first and with a second polarization plane, wherein the exposure unit contains
    a light source,
    a spatial light intensity modulator, which is controlled electronically, and which is a digital mirror device or an organic light emitting diode display, a polarizer, and a projection lens, wherein the polarizer is arranged between the spatial light intensity modulator and the designated position of the substrate on the support and wherein changing of the polarization plane is controlled electronically.

2. Apparatus according to claim 1, which comprises an additional light source providing polarized light.

3. Apparatus according to claim 1, which additionally comprises a coating or printing unit.

4. Apparatus according to claim 1, which additionally comprises a heating stage.

5. Apparatus according to claim 1, which additionally comprises a purging unit.

6. A method for fast production of elements with individually patterned anisotropic properties, comprising the steps providing an LCMO layer and exposing the LCMO layer in an apparatus according to claim 1 to the spatially intensity modulated aligning light of an SLM exposure unit, having a first polarization plane.

7. A method according to claim 6, wherein the LCMO layer is additionally exposed to aligning with a second polarization plane.

8. A method according to claim 7, wherein the aligning light with the second polarization plane is also provided by an SLM exposure unit and addressing of the SLM is such that projected SLM light with the first polarization plane represents at least in a certain area a grey scale pattern on the LCMO layer and projected SLM light with the second polarization plane represents the same pattern at the same location on the LCMO layer but with a different gradient of grey scale intensities.

9. A method according to claim 8, wherein the grey scales of the pattern projected with the second polarization plane are inversed compared to the grey scales of the pattern projected with the first polarization plane.

10. A method according to claim 6, wherein the projection area of the SLM exposure unit and the substrate move relative to each other during exposure of the LCMO layer to the aligning light of the SLM exposure unit and the SLM is addressed such that the pattern to be projected to the LCMO layer scrolls across the pixels of the SLM.

11. A method according to claim 6, wherein the spatially modulated aligning light of the SLM exposure unit is obliquely incident onto the LCMO layer.

12. A method according to claim 6, wherein the LCMO layer is additionally exposed to obliquely incident polarized or un-polarized actinic light.

13. A method according to claim 6, wherein there is at least one wavelength within the range from 350 nm to 420 nm, for which the LCMO layer has an absorption coefficient larger than 200 [1/cm].

14. A method according to claim 6, wherein in a subsequent step a slave material is applied on top of the irradiated LCMO layer.

15. A method according to claim 14, wherein the slave material is a liquid crystal polymer material.

16. A method according to claim 14, wherein in an additional step non-polymerized materials are removed from the slave material.

* * * * *